(12) United States Patent
Kamo et al.

(10) Patent No.: US 12,319,829 B2
(45) Date of Patent: Jun. 3, 2025

(54) ORGANIC ELECTRONIC MATERIAL AND USE THEREOF

(71) Applicant: Showa Denko Materials Co., Ltd., Tokyo (JP)

(72) Inventors: Kazuyuki Kamo, Tokyo (JP); Iori Fukushima, Tokyo (JP); Tomotsugu Sugioka, Tokyo (JP); Kenichi Ishitsuka, Tokyo (JP); Akihiro Yoshida, Tokyo (JP)

(73) Assignee: Resonac Corporation, Tokyo (JP)

( * ) Notice: Subject to any disclaimer, the term of this patent is extended or adjusted under 35 U.S.C. 154(b) by 1049 days.

(21) Appl. No.: 17/279,594

(22) PCT Filed: Sep. 28, 2018

(86) PCT No.: PCT/JP2018/036328
§ 371 (c)(1),
(2) Date: Mar. 25, 2021

(87) PCT Pub. No.: WO2020/065926
PCT Pub. Date: Apr. 2, 2020

(65) Prior Publication Data
US 2021/0395441 A1    Dec. 23, 2021

(51) Int. Cl.
| | | |
|---|---|---|
| *C09D 165/00* | (2006.01) | |
| *C08G 61/12* | (2006.01) | |
| *C09D 11/10* | (2014.01) | |
| *C09D 11/52* | (2014.01) | |
| *G09F 9/30* | (2006.01) | |
(Continued)

(52) U.S. Cl.
CPC .......... *C09D 165/00* (2013.01); *C08G 61/12* (2013.01); *C09D 11/10* (2013.01); *C09D 11/52* (2013.01); *G09F 9/301* (2013.01); *H10K 77/111* (2023.02); *H10K 85/111* (2023.02);
(Continued)

(58) Field of Classification Search
CPC .............. C08G 1/12; C08G 2261/3162; C08G 2261/411; C08G 2261/76; C08G 2261/95; C08G 73/0246; H10K 77/111; H10K 85/111; H10K 50/17; H10K 50/15; H10K 50/115; H10K 50/12; C09D 11/10; C09D 11/52; C09D 11/38; C09D 5/24; C09D 179/02; G09F 9/301; H01L 51/0094; H01L 51/0039; H01L 51/0035; H01L 51/0043; H01L 51/5056; H01L 51/5088; C08L 79/02
See application file for complete search history.

(56) References Cited

FOREIGN PATENT DOCUMENTS

| | | |
|---|---|---|
| CN | 102304226 | 1/2012 |
| CN | 105566127 | 5/2016 |
(Continued)

OTHER PUBLICATIONS

Ayataka Endo et al., "Thermally Activated Delayed Fluorescence from Sn4+-Porphyrin Complexes and Their Application to Organic Light Emitting Diodes—A Novel Mechanism for Electroluminescence, " Advanced Materials, Dec. 15, 2009, pp. 4802-4806.
(Continued)

*Primary Examiner* — Shane Fang
(74) *Attorney, Agent, or Firm* — JCIPRNET

(57) ABSTRACT

An organic electronic material including a charge transporting polymer having a structure that is represented by Formula (1) and that is branched in three or more directions (in the formula, Rf's are each independently a fluoroalkyl group, a and b are 0 or 1, and a and b are not both 0 at the same time).

17 Claims, 1 Drawing Sheet

(51) Int. Cl.
   H10K 50/15    (2023.01)
   H10K 50/17    (2023.01)
   H10K 77/10    (2023.01)
   H10K 85/10    (2023.01)
(52) U.S. Cl.
   CPC ............... C08G 2261/3162 (2013.01); C08G 2261/411 (2013.01); H10K 50/15 (2023.02); H10K 50/17 (2023.02)

(56) References Cited

FOREIGN PATENT DOCUMENTS

| | | |
|---|---|---|
| JP | 2000036390 | 2/2000 |
| JP | 2003213002 | 7/2003 |
| JP | 2005075948 | 3/2005 |
| JP | 2006279007 | 10/2006 |
| JP | 2017069324 | 4/2017 |
| WO | 2010140553 | 12/2010 |

OTHER PUBLICATIONS

Ayataka Endo et al., "Efficient up-conversion of triplet excitons into a singlet state and its application for organic light emitting diodes," Applied Physics Letters, Feb. 24, 2011, pp. 083302-1-083302-3.

Tetsuya Nakagawa et al., "Electroluminescence based on thermally activated delayed fluorescence generated by a spirobifluorene donor-acceptor structure," Chemical Communications, Apr. 17, 2012, pp. 9580-9582.

Sae Youn Lee et al., "High efficiency organic light-emitting diodes utilizing thermally activated delayed fluorescence from triazine-based donor-acceptor hybrid molecules," Applied Physics Letters, Aug. 30, 2012, pp.093306-1-093306-4.

Qisheng Zhang et al., "Design of Efficient Thermally Activated Delayed Fluorescence Materials for Pure Blue Organic Light Emitting Diodes," Journal of the American Chemical Society, Aug. 29, 2012, pp. 14706-14709.

Hiroyuki Tanaka et al., "Efficient green thermally activated delayed fluorescence (TADF) from a phenoxazine-triphenyltriazine (PXZ-TRZ) derivative," Chemical Communications, Dec. 4, 2012, pp. 11392-11394.

Jie Li et al., "Highly Efficient Organic Light-Emitting Diode Based on a Hidden Thermally Activated Delayed Fluorescence Channel in a Heptazine Derivative," Advanced Materials, May 13, 2013, pp. 3319-3323.

Ryoichi Ishimatsu et al., "Solvent Effect on Thermally Activated Delayed Fluorescence by 1,2,3,5-Tetrakis (carbazol-9-yl)-4,6-dicyanobenzene," The Journal of Physical Chemistry A, Jun. 12, 2013, pp. 5607-5612.

Thomas Serevicius et al., "Enhanced electroluminescence based on thermally activated delayed fluorescence from a carbazole-triazine derivative," Physical Chemistry Chemical Physics, Aug. 2, 2013, pp. 15850-15855.

Keiro Nasu et al., "A highly luminescent spiro-anthracenone-based organic light-emitting diode exhibiting thermally activated delayed fluorescence," Chemical Communications, Sep. 27, 2013, pp. 10385-10387.

Hiroki Uoyama et al., "Highly efficient organic light-emitting diodes from delayed fluorescence," Nature, Dec. 13, 2012, pp. 234-238.

Bo Li et al., "Dicarbazolyldicyanobenzenes as Thermally Activated Delayed Fluorescence Emitters: Effect of Substitution Position on Photoluminescent and Electroluminescent Properties," Chemistry Letters, Nov. 13, 2013, pp. 319-321.

Kengo Hirose et al., "26p-ZK-4, High efficiency of PLED using cross-linkable hole transport material", proceedings of 53rd Joint Lecture on Applied Physics with English translation thereof, Mar. 22-26, 2006, pp. 1407.

"International Search Report (Form PCT/ISA/210) of PCT/JP2018/036328", mailed on Dec. 25, 2018, with English translation thereof, pp. 1-4.

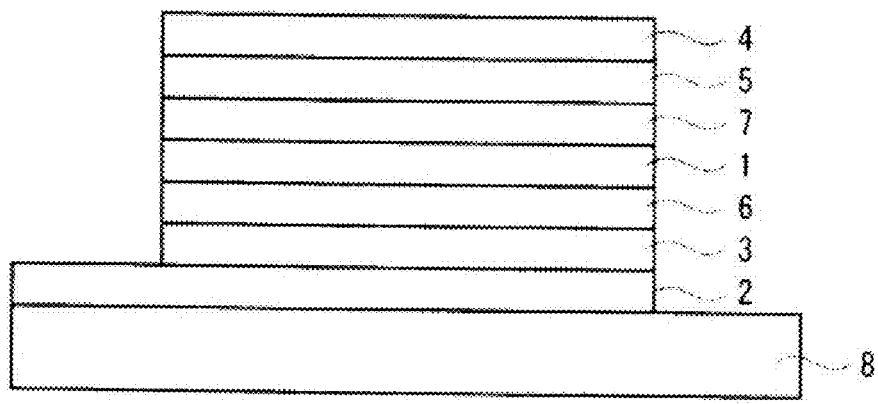

ORGANIC ELECTRONIC MATERIAL AND USE THEREOF

CROSS-REFERENCE TO RELATED APPLICATION

This application is a 371 application of the international PCT application serial no. PCT/JP2018/036328, filed on Sep. 28, 2018. The entirety of the above-mentioned patent applications is hereby incorporated by reference herein and made a part of this specification.

TECHNICAL FIELD

The present disclosure relates to an organic electronic material including a charge transporting polymer having high solubility in various solvents. The present disclosure also relates to an ink composition, an organic thin film, an organic electronic element, and an organic electroluminescent element, all of which are formed of the organic electronic material; and relates to a display element, a lighting device, and a display device, all of which are formed of the organic electroluminescent element.

BACKGROUND ART

Organic electronic elements are elements that perform electrical operations using organic substances. Organic electronic elements are expected to exhibit features such as energy saving, low cost, and flexibility, and therefore they are attracting attention in techniques for enabling replacement of conventional inorganic semiconductors mainly composed of silicon. Examples of organic electronic elements include organic electroluminescent elements (hereinafter, also referred to as "organic EL elements"), organic photoelectric conversion elements, organic transistors, and the like.

Organic EL elements are attracting attention for use in large-area solid-state light source applications in place of, for example, incandescent lamps or gas-filled lamps. They are also attracting attention as the most promising self-luminous displays in place of liquid crystal displays (LCDs) in the field of flat panel displays (FPDs), and therefore commercialization of organic EL elements is progressing.

Methods for manufacturing an organic EL element are roughly classified into two categories: a dry-type process in which film formation is performed mainly in a vacuum system, and a wet-type process in which film formation is performed by plate printing such as relief printing and intaglio printing, plateless printing such as inkjet printing, and the like. Among them, the wet-type process is expected as an indispensable method for future large-screen organic EL displays, because it enables simple film formation.

Under these circumstances, in recent years, polymer compounds suitable for the wet-type processes have been developed. For example, a method of forming an organic EL element having a multilayer structure by a wet-type process using a charge transporting polymer having a polymerizable functional group has been reported (refer to, for example, Patent Literature 1 and Non-Patent Literature 1).

CITATION LIST

Patent Literature

Patent Literature 1

Japanese Patent Laid-Open No. 2006-279007

Non-Patent Literature

Non-Patent Literature 1

Kengo Hirose, Daisuke Kumaki, Nobuaki Koike, Akira Kuriyama, Seiichiro Ikehata, and Shizushi Tokito, 53rd Joint Lecture on Applied Physics, 26p-ZK-4 (2006)

SUMMARY OF INVENTION

Technical Problem

An organic EL element manufactured by the wet-type process has features of easy realization of lower cost and larger area. However, the organic EL element manufactured by the wet-type process is not necessarily sufficient in terms of element characteristics such as drive voltage, luminous efficiency, and emission lifespan, and further improvement is desired.

In the wet-type process, an ink composition (also referred to as varnish) containing a charge transporting polymer and a solvent is typically used, and it is desired that the charge transporting polymer have excellent charge transportability and high solubility in various solvents. In particular, solubility of the charge transporting polymer is important not only from the viewpoint of workability in the case of film formation but also from the viewpoint of manufacturing a uniform film for improving element characteristics. Furthermore, for example, in inkjet printing, it is desirable to use various solvents in order to appropriately adjust characteristics such as viscosity of the ink composition.

However, conventional charge transporting polymers are not necessarily sufficiently applicable to inkjet printing, because they have low solubility in solvents, and this often limits solvents that can be used in preparation of ink compositions. Accordingly, there is a demand for a charge transporting polymer having high solubility in various solvents.

In view of the above circumstances, the present disclosure provides an organic electronic material including a charge transporting polymer having high solubility in various solvents. The present disclosure also relates to an ink composition, an organic thin film, an organic electronic element, and an organic EL element, all of which are formed of the organic electronic material; and relates to a display element, a lighting device, and a display device, all of which are formed of the organic EL element.

Solution to Problem

As a result of diligent studies, the inventors of the present invention have found that solubility of a charge transporting polymer is improved by introducing a fluoroalkyl group at a predetermined position on a benzene ring having a triphenylamine structure in the charge transporting polymer. Thereby, the present invention has been completed.

That is, the present invention relates to embodiments described below. However, the present invention is not limited to the following embodiments, and includes various embodiments.

One embodiment relates an organic electronic material including a charge transporting polymer having a structure represented by Formula (1) and having a structure branched in three or more directions.

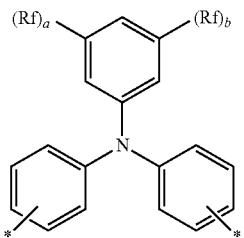

(1)

In the formula, Rf's are each independently a fluoroalkyl group, a and b are 0 or 1, and a and b are not both 0 at the same time.

In the above embodiment, the charge transporting polymer preferably has hole injectability or hole transportability.

The charge transporting polymer preferably further has one or more structures selected from the group consisting of an aromatic amine structure, a pyrrole structure, a carbazole structure, a thiophene structure, a benzene structure, an aniline structure, a phenoxazine structure, and a fluorene structure, where the structure represented by Formula (1) is excluded.

The charge transporting polymer preferably has at least one polymerizable functional group. The polymerizable functional group is preferably at least one selected from the group consisting of an oxetane group, an epoxy group, a vinyl group, an acryloyl group, and a methacryloyl group.

The organic electronic material preferably further includes a polymerization initiator. The polymerization initiator is preferably an ionic compound. The ionic compound is preferably an onium salt.

Another embodiment relates to an ink composition including: the organic electronic material of the above-described embodiment, and a solvent.

Still another embodiment relates to an organic thin film which is formed using the organic electronic material of the above-described embodiment or the ink composition of the above-described embodiment.

Still another embodiment relates to an organic electroluminescent element including the organic thin film of the above-described embodiment. The organic electroluminescent element preferably further includes a flexible substrate. The organic electroluminescent element preferably further includes a resin film substrate.

Still another embodiment relates to a display element including the organic electroluminescent element of the above-described embodiment.

Still another embodiment relates to a lighting device including the organic electroluminescent element of the above-described embodiment.

Still another embodiment relates to a display device including: the lighting device of the above-described embodiment, and a liquid crystal element as a display means.

Advantageous Effects of Invention

According to the present invention, it is possible to provide an organic electronic material including a charge transporting polymer having high solubility in various solvents.

BRIEF DESCRIPTION OF DRAWINGS

The figure is a schematic cross-sectional view showing an example of an organic EL element according to an embodiment of the present disclosure.

DESCRIPTION OF EMBODIMENTS

Hereinafter, embodiments of the present invention will be specifically described, but the present invention is not limited to the following embodiments.
<Organic electronic material>

In one embodiment, an organic electronic material includes a charge transporting polymer having a structure represented by Formula (1) and having a structure branched in three or more directions.

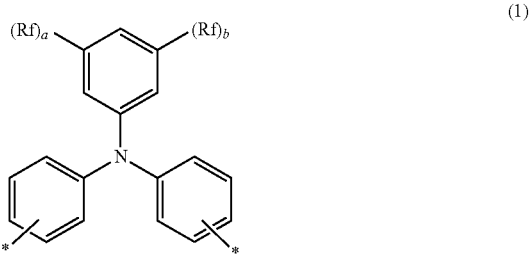

(1)

In the formula, Rf's are each independently a fluoroalkyl group, a and b are 0 or 1, and a and b are not both 0 at the same time.

The above-mentioned "fluoroalkyl group" means a group having a structure in which at least one hydrogen atom in an alkyl group is substituted with a fluorine atom. The alkyl group may have a linear structure or a branched structure. The number of carbon atoms in the fluoroalkyl group is preferably 1 to 5, is more preferably 1 to 3, and is even more preferably 1 or 2. In one embodiment, the fluoroalkyl group is preferably a perfluoroalkyl group. The number of carbon atoms in the perfluoroalkyl group is preferably 1 to 5, is more preferably 1 to 3, and is even more preferably 1 or 2. In one embodiment, it is preferable that Rf's be each independently $-CF_3$ or $-C_2F_5$ in the formula.

As represented by Formula (1), a fluoroalkyl group such as $-CF_3$ is introduced into a meta position of a benzene ring bonded to a nitrogen atom in a triphenylamine structure, and thereby it becomes easy to obtain high solubility in various solvents. The term "high solubility" means a state in which a polymer dissolves in a solvent, and the solution appears transparent with no turbidity, as specifically shown in examples.

In one embodiment, it is more preferable that a and b be each 1 in Formula (1). In one embodiment, in the triphenylamine structure, a hydrogen atom in a benzene ring other than the benzene ring having the fluoroalkyl group may be substituted with a substituent. The substituent may be the same as, for example, a substituent R of a structural unit L2 to be described later. The organic electronic material may contain one or two or more of the charge transporting polymers. Hereinafter, the charge transporting polymer will be specifically described.

(Charge Transporting Polymer)

The charge transporting polymer has a structure represented by Formula (1) and has a branched structure branched in three or more directions. Accordingly, the charge transporting polymer is characterized in that it has at least a divalent structural unit L having charge transportability, a trivalent or higher-valent structural unit B constituting a branch portion, and a monovalent structural unit T constituting a terminal portion, in which the divalent structural unit L includes at least a structural unit having the structure represented by Formula (1). The charge transporting polymer may have only one kind of each of the structural units, or may have a plurality of kinds of each of the structural units. In the charge transporting polymer, the structural units are respectively bonded to each other at a "monovalent" to "trivalent or higher-valent" binding site.

It is more preferable that the charge transporting polymer have an ability to transport charges, and charges to be transported be holes. In a case where the charge transporting polymer is a hole transport compound, for example, it can be used as a material for a hole injection layer and a hole transport layer of an organic EL element. Furthermore, in a case where the charge transporting polymer is an electron transport compound, it can be used as a material for an electron transport layer and an electron injection layer. Furthermore, in a case where the charge transporting polymer is a compound that transports both holes and electrons, it can be used as a material for a light emitting layer. In one embodiment, the charge transporting polymer is preferably used as a material for a hole injection layer and/or a hole transport layer, and is more preferably used as a material for a hole injection layer.

In the present specification, the term "charge transporting polymer" also includes an "oligomer" having a low degree of polymerization and a low molecular weight. Hereinafter, a structure of the charge transporting polymer composed of a plurality of structural units having charge transportability will be described more specifically.

(Structure of Charge Transporting Polymer)

Examples of partial structures included in the charge transporting polymer include the following structures. The charge transporting polymer is not limited to polymers having the following partial structures. Regarding partial structures, "L" represents a structural unit L, "T" represents a structural unit T, and "B" represents a structural unit B. "*" represents a binding site with another structural unit. In the following partial structures, a plurality of L's may be the same structural unit or different structural units from each other. The same applies to T and B.

Charge transporting polymer having branched structure

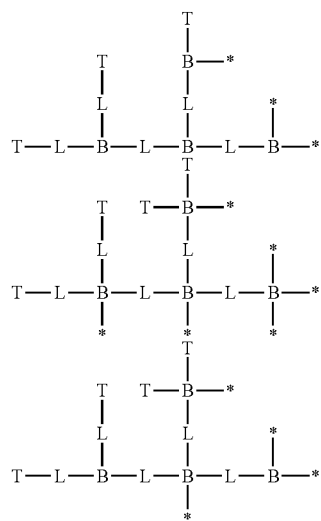

-continued

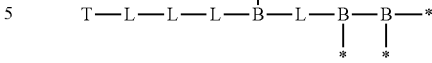

In one embodiment, the charge transporting polymer having the structure represented by Formula (1) preferably further has at least one structure selected from the group consisting of an aromatic amine structure (where the structure represented by Formula (1) is excluded), a carbazole structure, a thiophene structure, a bithiophene structure, a benzene structure, a phenoxazine structure, and a fluorene structure. Preferably, these structures may be included in the structural unit L, may be included in the structural unit B, or may be included in both the structural unit L and the structural unit B. In a case where the charge transporting polymer has any of the above-mentioned structures, charge transportability, particularly hole transportability, can be improved. Hereinafter, the structural unit of the charge transporting polymer will be described more specifically.

(Structural unit L)

The structural unit L is a divalent structural unit having charge transportability, and includes at least a structural unit having the structure represented by Formula (1) (hereinafter, referred to as structural unit L1). In one embodiment, the structural unit L1 preferably includes a structural unit L1-1 having a structure represented by Formula (1-1) among the structural units represented by Formula (1).

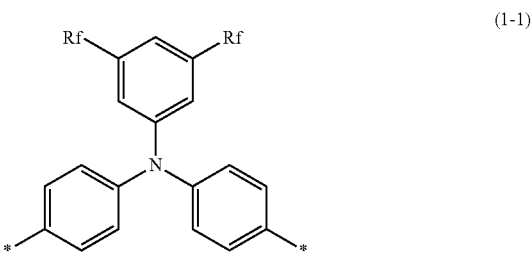

(1-1)

In the formula, Rf's are each independently a fluoroalkyl group. The fluoroalkyl group is as described above. In one embodiment, it is preferable that Rf's be each independently $-CF_3$ or $-C_2F_5$.

The charge transporting polymer having the structural unit L1 has excellent solubility in various solvents. Accordingly, it is possible to improve workability in a case of film formation such as preparation of a coating solution for an organic thin film constituting an organic electronic element. Furthermore, it is thought that manufacturing of a uniform film in a case of film formation is facilitated, which leads to improvement in element characteristics.

In addition to the structural unit L1, the structural unit L may include a structural unit L2 different from the structural unit L1. The structural unit L2 is not particularly limited as long as it contains an atomic group having an ability to transport charges. For example, the structural unit L2 is selected from an aromatic amine structure (where the structure represented by Formula 1 is excluded), a carbazole structure, a thiophene structure, a fluorene structure, a benzene structure, a biphenyl structure, a terphenyl structure, a naphthalene structure, an anthracene structure, a tetracene structure, a phenanthrene structure, a dihydrophenanthrene structure, a pyridine structure, a pyrazine structure, a quinoline structure, an isoquinoline structure, a quinoxaline structure, an acridine structure, a diazaphenanthrene structure, a furan structure, a pyrrole structure, an oxazole structure, an oxadiazole structure, a thiazole structure, a thiadiazole structure, a triazole structure, a benzothiophene structure, a benzoxazole structure, a benzoxadiazole structure, a benzothiazole structure, a benzothiadiazole structure, a benzotriazole structure, and a structure containing one or two or more of these structures (where these structures are substituted or unsubstituted).

The aromatic amine structure is a structure containing a nitrogen atom and an aromatic hydrocarbon group bonded to the nitrogen atom, and is preferably a structure selected from the group consisting of a diarylamine structure or a triarylamine structure. The aromatic amine structure is more preferably a triarylamine structure, and is even more preferably a triphenylamine structure.

In one embodiment, from the viewpoint of obtaining excellent hole transportability, the structural unit L2 is preferably selected from an aromatic amine structure, a carbazole structure, a thiophene structure, a fluorene structure, a benzene structure, a pyrrole structure, and a structure containing one or two or more of these structures (where these structures are substituted or unsubstituted), is more preferably selected from an aromatic amine structure, a carbazole structure, and a structure containing one or two or more of these structures (where these structures are substituted or unsubstituted), and is even more preferably a substituted or unsubstituted aromatic amine structure. The aromatic amine structure does not include the structure represented by Formula (1).

Specific examples of the structural unit L2 include the following structural units. The structural unit L2 is not limited to the following examples.

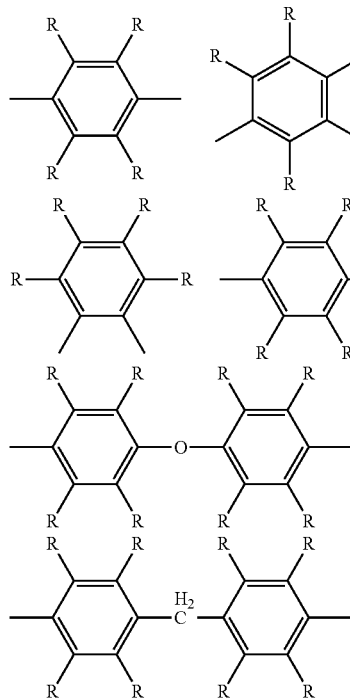

-continued

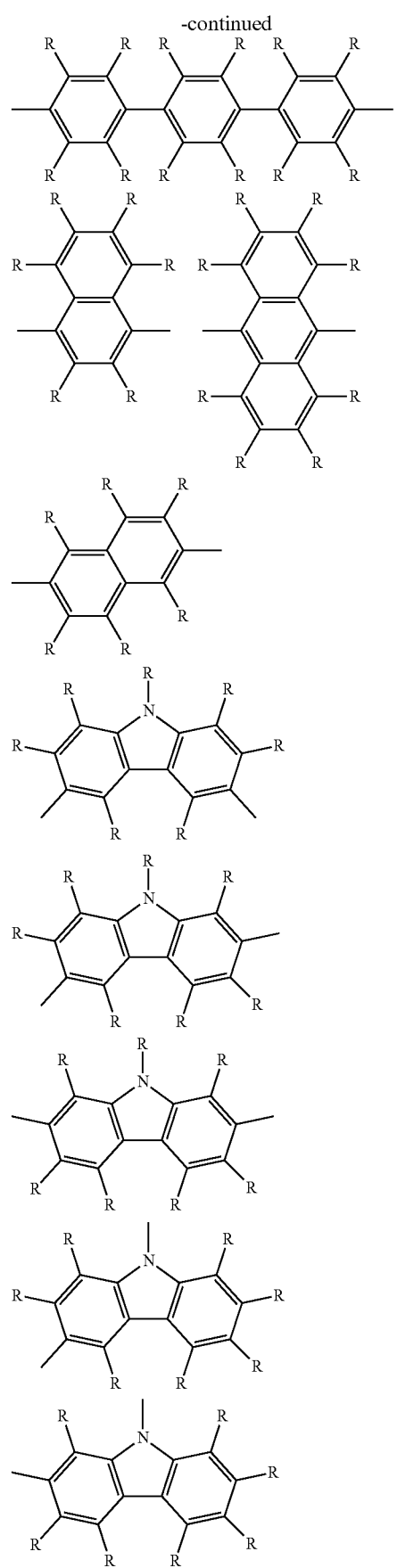

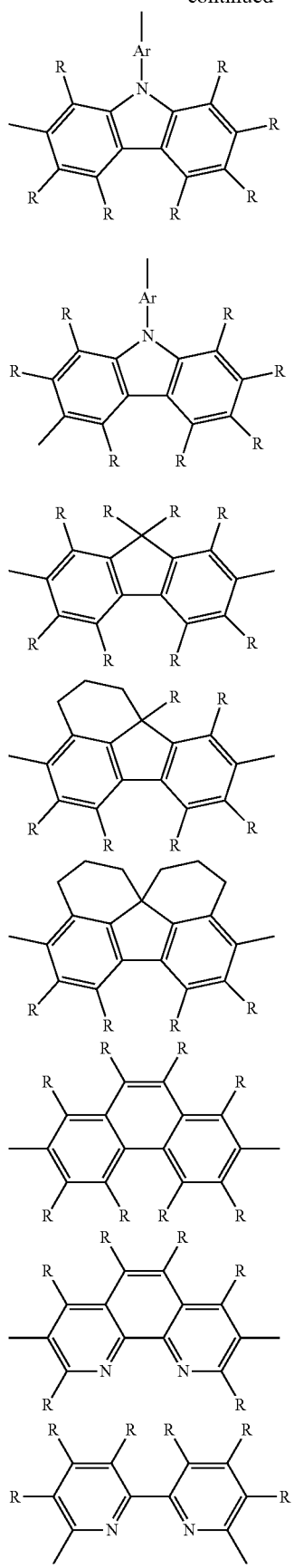
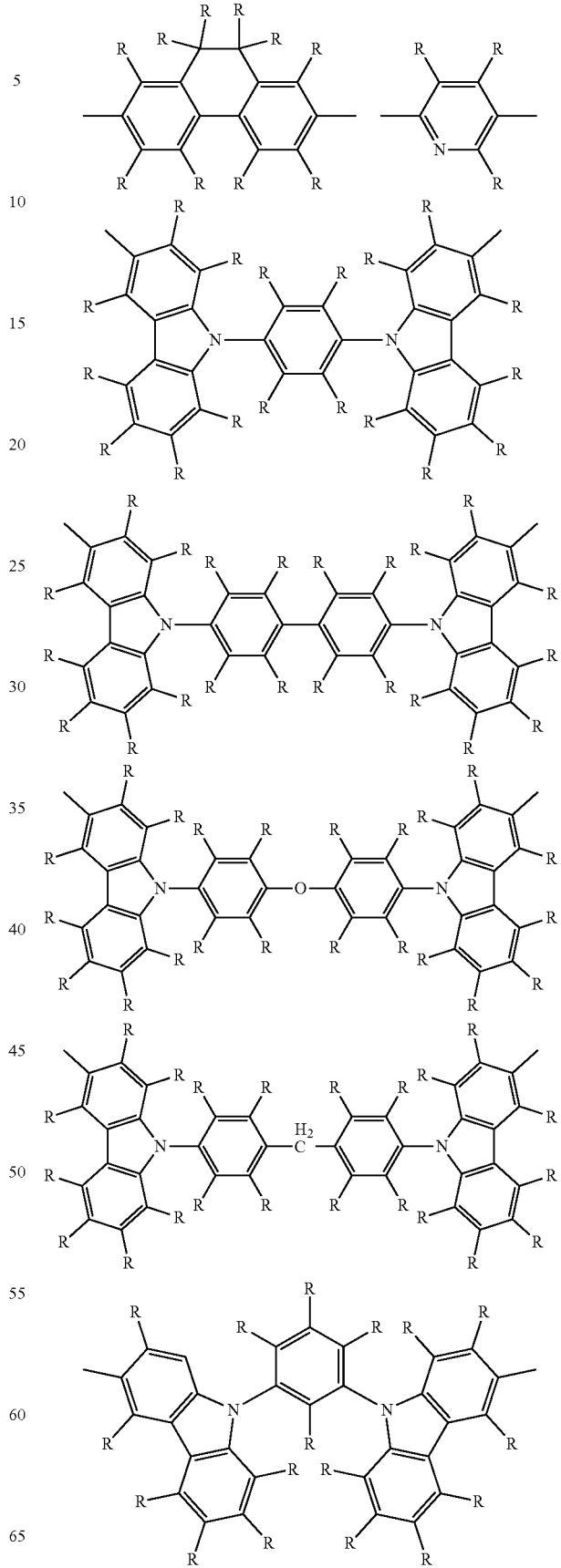

-continued
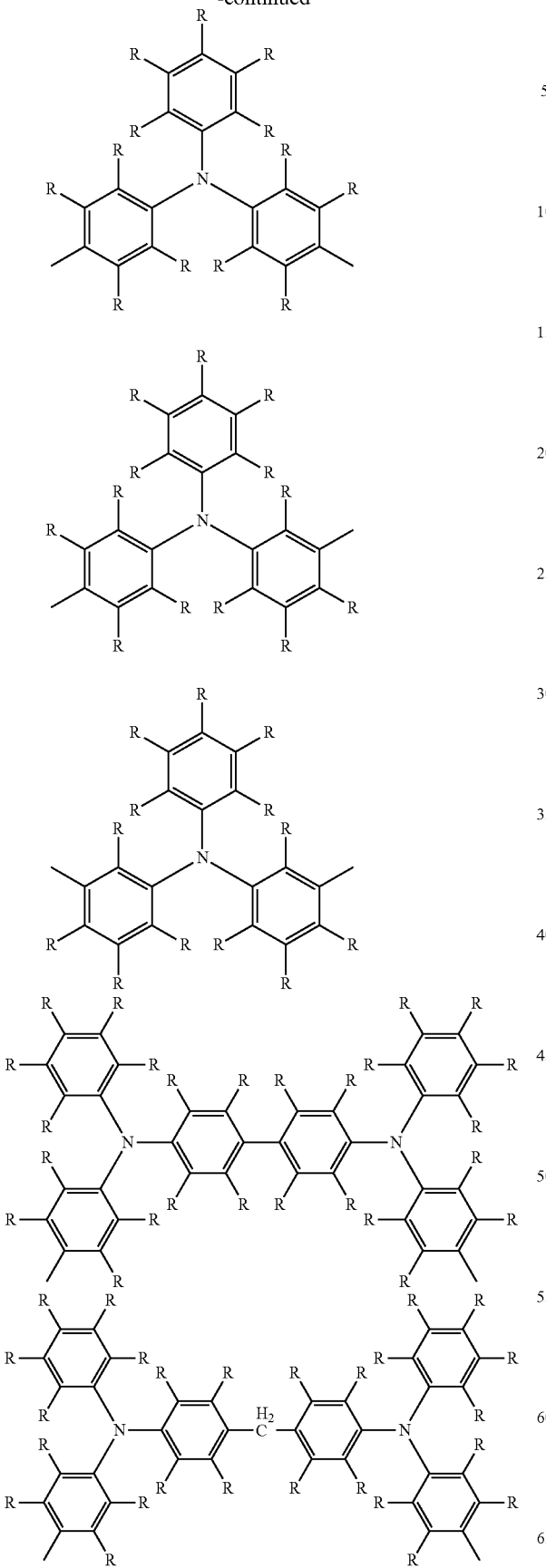
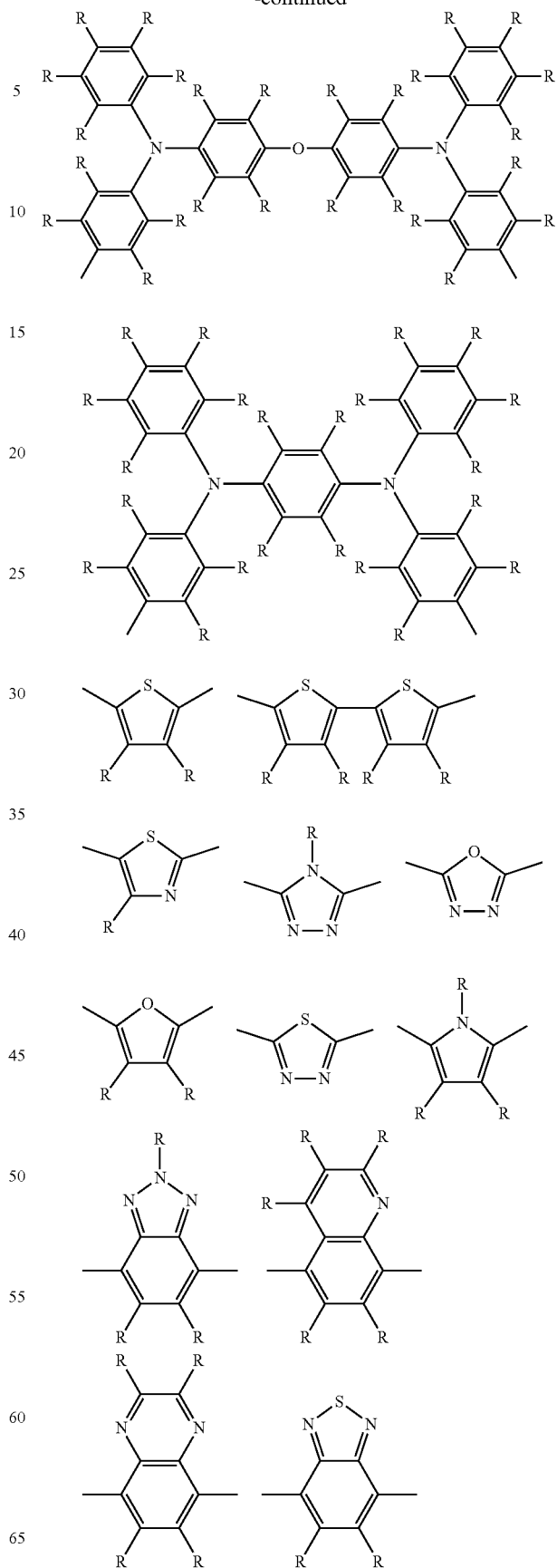

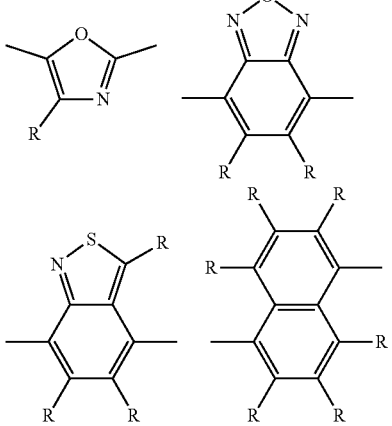

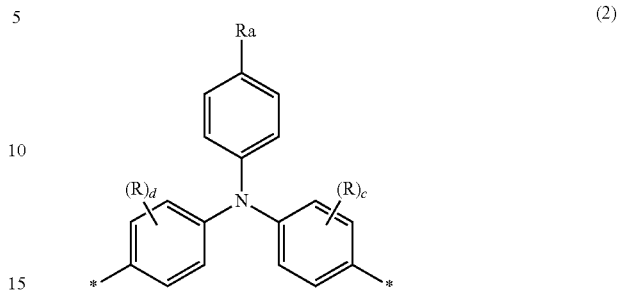

R's each independently represent a hydrogen atom or a substituent. In a case where R is a substituent, it is preferable that R's be each independently selected from the group consisting of —$R^1$, —$OR^2$, —$SR^3$, —$OCOR^4$, —$COOR^5$, —$SiR^6R^7R^8$, halogen atom, and groups having polymerizable functional groups to be described later. $R^1$ to $R^8$ each independently represent a hydrogen atom (not in the case of —$R^1$); a linear, cyclic or, branched alkyl group having 1 to 22 carbon atoms; or an aryl group or heteroaryl group having 2 to 30 carbon atoms.

An aryl group is an atomic group obtained by removing one hydrogen atom from an aromatic hydrocarbon. A heteroaryl group is an atomic group obtained by removing one hydrogen atom from an aromatic heterocyclic ring. The alkyl group may be further substituted by an aryl group or heteroaryl group having 2 to 20 carbon atoms, and the aryl group or heteroaryl group may be further substituted by a linear, cyclic, or branched alkyl group having 1 to 22 carbon atoms.

R is preferably a hydrogen atom, an alkyl group, an aryl group, or an alkyl-substituted aryl group. Ar represents an arylene group or heteroarylene group having 2 to 30 carbon atoms. An arylene group is an atomic group obtained by removing two hydrogen atoms from an aromatic hydrocarbon. A heteroarylene group is an atomic group obtained by removing two hydrogen atoms from an aromatic heterocyclic ring. Ar is preferably an arylene group and is more preferably a phenylene group.

Examples of aromatic hydrocarbons include a monocyclic ring, a fused ring, or a polycyclic ring in which two or more selected from monocyclic rings and fused rings are bonded via a single bond. Examples of aromatic heterocyclic rings include a monocyclic ring, a fused ring, or a polycyclic ring in which two or more selected from monocyclic rings and fused rings are bonded via a single bond.

In one embodiment, the structural unit L may be composed of only the structural unit L1. In another embodiment, the structural unit L may be a combination of the structural unit L1 and the structural unit L2. From the viewpoint of improving solubility of the charge transporting polymer, a ratio of the structural unit L1 is preferably 50 mol % or more, is more preferably 75 mol % or more, and is even more preferably 85 mol % or more, based on all structural units L. A ratio of the structural unit L1 can also be 100 mol %.

An appropriate combination of the structural unit L1 and the structural unit L2 facilitates improvement of desired characteristics. For example, the structural unit L2 prefer- ably includes a structural unit having an aromatic amine structure represented by Formula (2).

In the formula, Ra is an alkyl group (—$R^1$), an alkoxy group (—$OR^2$), or a halogen atom, and R is a substituent. Details thereof are as described above. c and d are each independently an integer of 0 to 4. In one embodiment, it is preferable that c and d be each 0.

In one embodiment, the structural unit L may include the structural unit L1, and a structural unit L2-1 represented by Formula (2-1). Excellent solubility is likely to be easily obtained even with such a combination of structural units.

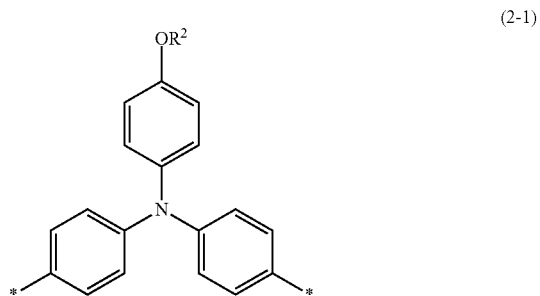

In the formula, —$OR^2$ is an alkoxy group, and details are as described above. In the above embodiment, a ratio of the structural unit L2-1 is preferably 75 mol % or less, is more preferably 50 mol % or less, and is even more preferably 25 mol % or less, based on a total of the structural units L. Meanwhile, a ratio of the structural unit L1 is preferably 25 mol % or more, is more preferably 50 mol % or more, and is even more preferably 75 mol % or more.

In one embodiment, the structural unit L may include the structural unit L1, and a structural unit L2-2 represented by Formula (2-2).

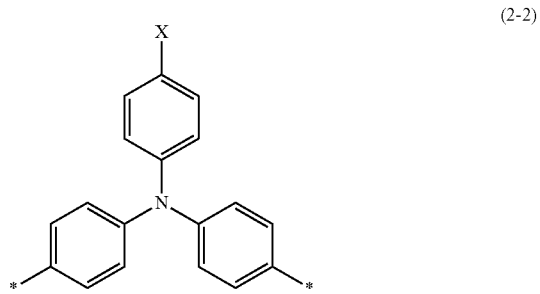

In the formula, X is a halogen atom. The halogen atom may be, for example, a chlorine atom or a fluorine atom. A fluorine atom is more preferred from the viewpoint of facilitating adjustment of HOMO levels.

From the viewpoint of solubility of the charge transporting polymer and a HOMO level, a ratio of the structural unit L2-2 is preferably 75 mol % or less, is more preferably 50 mol % or less, and is even more preferably 25 mol % or less, based on a total of the structural units L. Meanwhile, a ratio of the structural unit L2-2 is preferably 25 mol % or more, is more preferably 50 mol % or more, and is even more preferably 75 mol % or more.

(Structural Unit B)

The structural unit B is a trivalent or higher-valent structural unit having a structure constituting a branch portion of the charge transporting polymer. The structural unit B is preferably hexavalent or lower-valent, is more preferably pentavalent or lower-valent, and is even more preferably trivalent or tetravalent, from the viewpoint of improving durability of an organic electronic element. The structural unit B is preferably a unit having charge transportability. For example, from the viewpoint of improving durability of an organic electronic element, the structural unit B is selected from an aromatic amine structure, a carbazole structure, a fused polycyclic aromatic hydrocarbon structure, and a structure containing one or two or more of these structures (where these structures are substituted or unsubstituted).

Specific examples of the structural unit B include the following structural units. The structural unit B is not limited to the following examples.

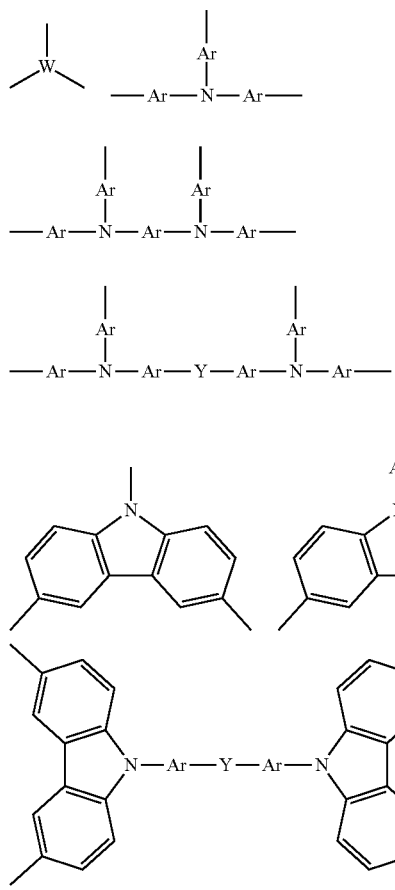

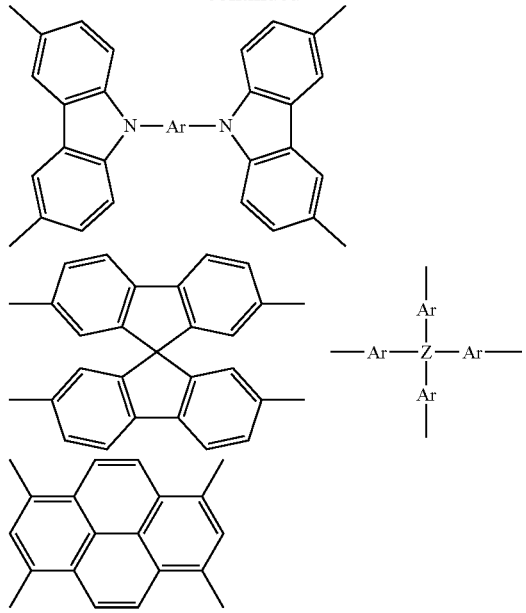

W represents a trivalent linking group, and represents, for example, an arenetriyl group or a heteroarenetriyl group having 2 to 30 carbon atoms. An arenetriyl group is an atomic group obtained by removing three hydrogen atoms from an aromatic hydrocarbon. A heteroarenetriyl group is an atomic group obtained by removing three hydrogen atoms from an aromatic heterocyclic ring. Ar's each independently represent a divalent linking group, and each independently represent, for example, an arylene group or heteroarylene group having 2 to 30 carbon atoms. Ar is preferably an arylene group and is more preferably a phenylene group. Y represents a divalent linking group, and examples thereof include a divalent group obtained by further removing one hydrogen atom from a group having one or more hydrogen atoms among R's in the structural unit L2 described above (where a group having a polymerizable functional group is excluded). Z represents any one of a carbon atom, a silicon atom, or a phosphorus atom. In the structural unit, a benzene ring and Ar may have a substituent, and examples of substituents include a substituent R in the structural unit L2.

In one embodiment, the structural unit B preferably has an aromatic amine structure, and more preferably has a structural unit B1 having a structure represented by Formula (3). As described above, a hydrogen atom in a benzene ring bonded to a nitrogen atom may be substituted by the substituent R.

(3)

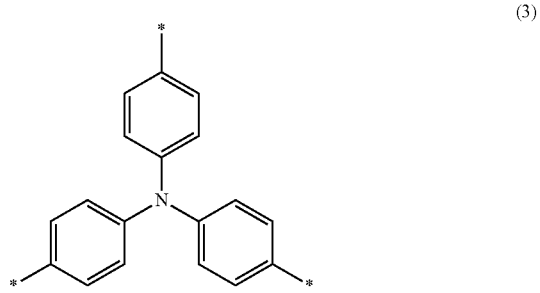 [SMILES: *c1ccc(N(c2ccc(*)cc2)c2ccc(*)cc2)cc1]

(Structural Unit T)

A structural unit T is a monovalent structural unit constituting a terminal portion of the charge transporting polymer. The structural unit T is not particularly limited, and is selected from, for example, an aromatic hydrocarbon structure, an aromatic heterocyclic structure, and a structure containing one or two or more of these structures (where these structures are substituted or unsubstituted).

In one embodiment, the charge transporting polymer preferably has a polymerizable functional group at a terminal portion from the viewpoint of enhancing curability. From such a viewpoint, in one embodiment, the charge transporting polymer preferably has a structural unit T1 having a polymerizable functional group as a terminal structure (structural unit T). In one embodiment, the structural unit T1 preferably has a structure represented by Formula (4).

(4)

In the formula, Ar represents an arylene group or a heteroarylene group, Q represents a single bond or a linking group, and Z represents a substituted or unsubstituted polymerizable functional group.

In one embodiment, Q in the above formula is preferably a linking group. The linking group is not particularly limited, but it is preferably composed of X and Y as represented by Formula (4-1).

(4-1)

In the formula, Ar is an arylene group or a heteroarylene group, X is a linking group to be described later, Y is an aliphatic hydrocarbon group having 1 to 10 carbon atoms, and Z is a substituted or unsubstituted polymerizable functional group.

In each of the formulas, Ar represents an arylene group or heteroarylene group having 2 to 30 carbon atoms, and means a group having a structure obtained by removing two hydrogen atoms from an aromatic ring of an aromatic hydrocarbon or an aromatic heterocyclic ring. Ar is preferably an arylene group or heteroarylene group having 2 to 30 carbon atoms. An aromatic ring may have a monocyclic structure such as benzene, or may have a fused ring structure, such as naphthalene, in which rings are fused with each other.

Specific examples of compounds having an aromatic ring include aromatic hydrocarbons such as benzene, naphthalene, anthracene, tetracene, fluorene, and phenanthrene. Specific examples thereof further include aromatic heterocyclic rings such as pyridine, pyrazine, quinoline, isoquinoline, acridine, phenanthroline, furan, pyrrole, thiophene, carbazole, oxazole, oxadiazole, thiadiazole, triazole, benzoxazole, benzoxadiazole, benzothiadiazole, benzotriazole, and benzothiophene.

An aromatic ring may have a structure in which two or more selected from independent monocyclic rings and fused rings are bonded. Examples of aromatic rings having such a structure include biphenyl, terphenyl, and triphenylbenzene. An aromatic ring may be unsubstituted, or may have one or more substituents. A substituent may be, for example, a linear, cyclic, or branched alkyl group having 1 to 22 carbon atoms.

In one embodiment, Ar is preferably a phenylene group or a naphthylene group, and is more preferably a phenylene group.

In Formula (4-1), X is any one linking group selected from the group consisting of Formulas (x1) to (x10).

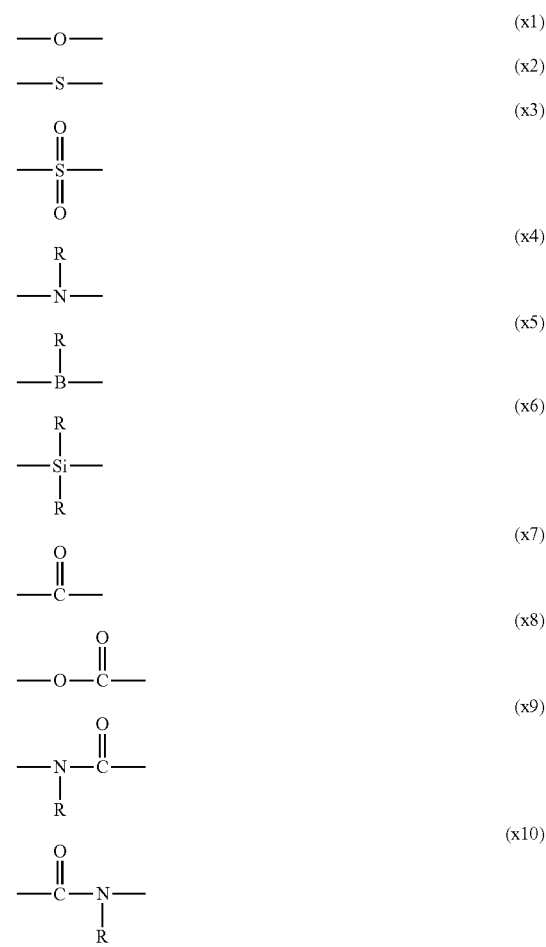

In the formula, R's each independently represent a hydrogen atom, a linear, cyclic, or branched alkyl group having 1 to 22 carbon atoms, or an aryl group or heteroaryl group having 2 to 30 carbon atoms. In one embodiment, R is preferably a linear, cyclic, or branched alkyl group having 1 to 22 carbon atoms. The number of carbon atoms is more preferably 2 to 16, is even more preferably 3 to 12, and is particularly preferably 4 to 8. In another embodiment, R is preferably an aryl having 6 to 30 carbon atoms, is more preferably a phenyl group or a naphthyl group, and is even more preferably a phenyl group.

In the charge transporting polymer having a structural unit indicated by —Ar—CH$_2$—O— at a terminal portion, intramolecular bonds are easily broken by heating, and heat resistance is likely to become poor. On the other hand, it is possible to improve heat resistance of the charge transporting polymer by forming a charge transporting polymer having a structural unit having the structure represented by Formula (4-1). As heat resistance is improved, thermal deterioration of an organic layer due to a high-temperature process in production of an element is improved, and therefore it becomes easy to maintain a performance of an organic thin film.

From such a viewpoint, in one embodiment, the charge transporting polymer preferably has at least the divalent structural unit L1 represented by Formula (1), the trivalent or higher-valent structural unit B forming a branch portion, and the monovalent structural unit T1-1 represented by Formula (4-1).

In one embodiment, a linking group X in Formula (4-1) is preferably x1. That is, the charge transporting polymer more preferably has a structural unit T1-2 represented by Formula (4-2).

—Ar—O—Y—Z    (4-2)

In Formula (4-2), Y is a divalent aliphatic hydrocarbon group having 1 to 10 carbon atoms. An aliphatic hydrocarbon group may have a linear, branched, or cyclic structure, or a structure in which these structures are combined. An aliphatic hydrocarbon group may be saturated or unsaturated.

In one embodiment, Y is preferably an aliphatic hydrocarbon group having a linear structure, and is more preferably saturated, from the viewpoint of easy availability of a monomer as a raw material. From these viewpoints, Y is preferably —(CH$_2$)n— in Formula (4-1). That is, in one embodiment, the charge transporting polymer more preferably has a structural unit T1-3 represented by Formula (4-3).

—Ar—X—(CH$_2$)$_n$—Z    (4-3)

In the formula, n is 1 to 10, is preferably 1 to 8, and is more preferably 1 to 6. From the viewpoint of heat resistance, n is more preferably 1 to 4, and n is most preferably 1 or 2.

As described above, the charge transporting polymer preferably has the structural unit represented by at least one of Formulas (4-2) and (4-3) as the structural unit T1, and more preferably has a structural unit T1-4 represented by Formula (4-4).

—Ar—O—(CH$_2$)$_n$—Z    (4-4)

In each of the above formulas, Z represents a polymerizable functional group. The "polymerizable functional group" refers to a functional group capable of forming a bond by being applied with heat and/or light. The polymerizable functional group Z may be unsubstituted, or may have a substituent. Specific examples of the polymerizable functional group Z include a group having a carbon-carbon multiple bond (for example, a vinyl group, an allyl group, a butenyl group, an ethynyl group, an acryloyl group, and a methacryloyl group), a group having a small ring (for example, a cyclic alkyl group such as a cyclopropyl group and a cyclobutyl group; a cyclic ether group such as an epoxy group (oxylanyl group) and an oxetane group (oxetanyl group); a diketene group; an episulfide group; a lactone group; a lactam group; and the like), a heterocyclic group (for example, a furan-yl group, a pyrrole-yl group, a thiophene-yl group, and a silole-yl group), and the like.

As the polymerizable functional group Z, a vinyl group, an acryloyl group, a methacryloyl group, an epoxy group, and an oxetane group are particularly preferable. A vinyl group, an oxetane group, and an epoxy group are more preferable from the viewpoint of reactivity and characteristics of an organic electronic element. These polymerizable functional groups may have a substituent. A substituent is preferably a linear, cyclic, or branched saturated alkyl group having 1 to 22 carbon atoms. The number of carbon atoms is more preferably 1 to 8, and is even more preferably 1 to 4. The substituent is most preferably a linear saturated alkyl group having 1 to 4 carbon atoms.

In one embodiment, from the viewpoint of storage stability, the polymerizable functional group Z is preferably an oxetane group represented by Formula (z1). In the formula, R may be a hydrogen atom or a saturated alkyl group having 1 to 4 carbon atoms. R is particularly preferably a methyl group or an ethyl group.

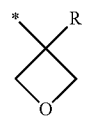
(z1)

The charge transporting polymer having the structural unit T1 contains at least one polymerizable functional group within its structure. A compound containing a polymerizable functional group can be cured by a polymerization reaction, and thereby solubility in a solvent can be changed by the curing. Accordingly, the charge transporting polymer having at least the structural unit T1 is a material which has excellent curability and is suitable for a wet-type process.

The charge transporting polymer may have a structural unit T2 that does not contain a polymerizable functional group as a terminal structure (structural unit T). Specific examples of the structural unit T2 include a structural unit having a structure represented by Formula (5).

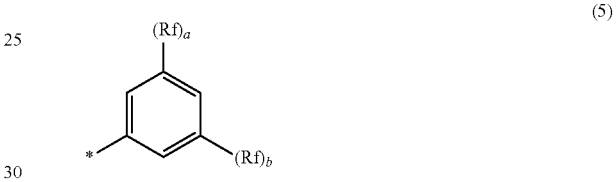
(5)

In the formula, Rf is a fluoroalkyl group, a and b are 0 or 1, and a and b are not both 0 at the same time. A fluoroalkyl group is as described in the descriptions for the structural unit L1. In one embodiment, Rf is preferably —CF$_3$ or —C$_2$F$_5$, and a and b are each preferably 1 in the formula.

The charge transporting polymer having a structural unit having a structure represented by Formula (5) (hereinafter referred to as structural unit T2) at a terminal portion is likely to exhibit high solubility. Accordingly, in a case where the charge transporting polymer has the structural unit T2 having the above structure in addition to the structural unit L1, it becomes easy to obtain high solubility.

In one embodiment, from the viewpoint of enhancing curability of the charge transporting polymer, a ratio of the structural unit T1 having a polymerizable functional group is preferably 50 mol % or more, is more preferably 75 mol % or more, and is even more preferably 85 mol % or more, based on the total structural units T. A ratio of the structural unit T1 can also be 100 mol %.

In one embodiment, in a case where the structural unit T2 is used in addition to the structural unit T1, a ratio of the structural unit T2 is preferably 75 mol % or less, is more preferably 50 mol % or less, and is even more preferably 25 mol % or less based on the total structural units T (T1+T2), from the viewpoint of increasing solubility of the charge transporting polymer. Meanwhile, a ratio of the structural unit T1 is preferably 25 mol % or more, is more preferably 50 mol % or more, and is even more preferably 75 mol % or more. By adjusting a ratio of the structural units T1 and T2 within the above range, it is possible to further improve solubility without lowering curability of the charge transporting polymer.

(Polymerizable functional group)

In one embodiment, the charge transporting polymer preferably has at least one polymerizable functional group in a molecule. As described above, as the structural unit T1, the polymerizable functional group may be introduced at a terminal portion of the charge transporting polymer, may be introduced at a part other than the terminal portion (that is, a structural unit L or B), and may be introduced at both the terminal portion and the part other than the terminal portion.

The polymerizable functional group is preferably introduced at least at the terminal portion from the viewpoint of curing properties, and it is preferably introduced only at the terminal portion from the viewpoint of achieving both curing properties and charge transportability. Furthermore, in the charge transporting polymer having a branched structure, the polymerizable functional group may be introduced into a main chain or a side chain of the charge transporting polymer, or may be introduced into both the main chain and the side chain thereof.

The polymerizable functional group is preferably contained in a large amount in the charge transporting polymer from the viewpoint of contributing to change in solubility. On the other hand, an amount contained in the charge transporting polymer is preferably small from the viewpoint of not hindering charge transportability. A content of the polymerizable functional group can be appropriately set in consideration of these points.

For example, the number of polymerizable functional groups per molecule of the charge transporting polymer is preferably 2 or more, and is more preferably 3 or more, from the viewpoint of obtaining a sufficient change in solubility. In addition, the number of polymerizable functional groups is preferably 1,000 or less and is more preferably 500 or less from the viewpoint of maintaining charge transportability. The number of polymerizable functional groups means, for example, a total of the number of polymerizable functional groups included in the structural unit T1 and the number of polymerizable functional groups included in the other structural units.

The number of polymerizable functional groups per molecule of the charge transporting polymer can be obtained as an average value using a ratio of a feed amount of monomers having a polymerizable functional group to a total feed amount of monomers which correspond to each of the structural units and are used for synthesizing the charge transporting polymer, a weight-average molecular weight of the charge transporting polymer, and the like.

In addition, the number of polymerizable functional groups can be calculated as an average value using a ratio of an integral value of a signal derived from the polymerizable functional group in the $^1$H NMR (nuclear magnetic resonance) spectrum of the charge transporting polymer to an integral value in the full spectrum, a weight-average molecular weight of the charge transporting polymer, and the like. In a case where a feed amount is clear, it is preferable to adopt a value obtained using the feed amount, because it is simple.

(Number Average Molecular Weight)

A number average molecular weight of the charge transporting polymer can be appropriately adjusted in consideration of solubility in a solvent, film forming properties, and the like. A number average molecular weight is preferably 500 or more, is more preferably 1,000 or more, and is even more preferably 2,000 or more, from the viewpoint of excellent charge transportability. In addition, a number average molecular weight is preferably 1,000,000 or less, is more preferably 100,000 or less, and is even more preferably 50,000 or less, from the viewpoint of maintaining favorable solubility in a solvent and facilitating preparation of an ink composition.

(Weight-Average Molecular Weight)

A weight-average molecular weight of the charge transporting polymer can be appropriately adjusted in consideration of solubility in a solvent, film forming properties, and the like. A weight-average molecular weight is preferably 1,000 or more, is more preferably 5,000 or more, and is even more preferably 10,000 or more, from the viewpoint of excellent charge transportability. In addition, a weight-average molecular weight is preferably 1,000,000 or less, is more preferably 700,000 or less, and is even more preferably 400,000 or less, from the viewpoint of maintaining favorable solubility in a solvent and facilitating preparation of an ink composition.

A number average molecular weight and a weight-average molecular weight can be measured by gel permeation chromatography (GPC) using a calibration curve for standard polystyrenes under the following conditions.

Liquid delivering pump: L-6050 of Hitachi High-Technologies Corporation

UV-Vis detector: L-3000 of Hitachi High-Technologies Corporation

Column: Gelpack (registered trademark) GL-A160S/GL-A150S of Hitachi Chemical Co., Ltd.

Eluent: THF (for HPLC, not containing a stabilizer) of Wako Pure Chemical Industries, Ltd.

Flow velocity: 1 mL/min

Column temperature: room temperature

Molecular weight standard substance: standard polystyrene (Ratio of Structural Units)

A ratio of the structural unit L included in the charge transporting polymer is preferably 10 mol % or more, is more preferably 20 mol % or more, and is even more preferably 30 mol % or more based on all structural units from the viewpoint of obtaining sufficient charge transportability. In addition, a ratio of the structural unit L is preferably 95 mol % or less, is more preferably 90 mol % or less, and is even more preferably 85 mol % or less in consideration of the structural unit T and the structural unit B. In one embodiment, in a case where the structural unit L is composed of only the structural unit L1, the above ratio means a ratio of the structural unit L1. In another embodiment, in a case where the structural unit L is a combination of the structural unit L1 and the structural unit L2, the above ratio means a total of the structural unit L1 and the structural unit L2.

A ratio of the structural unit T included in the charge transporting polymer is preferably 5 mol % or more, is more preferably 10 mol % or more, and is even more preferably 15 mol % or more based on all structural units from the viewpoint of improving characteristics of an organic electronic element, or from the viewpoint of suppressing an increase in viscosity and satisfactorily synthesizing the charge transporting polymer. In addition, a ratio of the structural unit T is preferably 60 mol % or less, is more preferably 55 mol % or less, and is even more preferably 50 mol % or less from the viewpoint of obtaining sufficient charge transportability. In one embodiment, in a case where the structural unit T is composed of only the structural unit T1, the above ratio means a ratio of the structural unit T1. In another embodiment, in a case where the structural unit T is a combination of the structural unit T1 and the structural unit T2, the above ratio means a total of the structural unit T1 and the structural unit T2.

A ratio of the structural unit B included in the charge transporting polymer is preferably 1 mol % or more, is more preferably 5 mol % or more, and is even more preferably 10 mol % or more based on all structural units from the viewpoint of improving durability of an organic electronic element. In addition, a ratio of the structural unit B is preferably 50 mol % or less, is more preferably 40 mol % or less, and is even more preferably 30 mol % or less, from the viewpoint of suppressing an increase in viscosity and satisfactorily synthesizing the charge transporting polymer, or from the viewpoint of obtaining sufficient charge transportability.

A ratio of a polymerizable functional group in the charge transporting polymer is preferably 0.1 mol % or more, is more preferably 1 mol % or more, and is even more preferably 3 mol % or more based on all structural units from the viewpoint of efficiently curing the charge transporting polymer. In addition, a ratio of the polymerizable functional group is preferably 70 mol % or less, is more preferably 60 mol % or less, and is even more preferably 50 mol % or less from the viewpoint of obtaining favorable charge transportability. The "ratio of the polymerizable functional group" referred to herein means a ratio of a structural unit having a polymerizable functional group.

A ratio (molar ratio) of the structural unit L, the structural unit T, and the structural unit B is preferably L:T:B=100:10 to 200:10 to 100, is more preferably 100:20 to 180:20 to 90, and is even more preferably 100:40 to 160:30 to 80, in consideration of a balance between charge transportability, durability, productivity, and the like.

A ratio of the structural units can be obtained using a feed amount of monomers corresponding to each of the structural units used for synthesizing the charge transporting polymer. Furthermore, a ratio of the structural units can be calculated as an average value using an integral value of a spectrum derived from each of the structural units in the $^1$H NMR spectrum of the charge transporting polymer. In a case where a feed amount is clear, it is preferable to adopt a value obtained using the feed amount, because it is simple.

In a case where the charge transporting polymer is a hole transport material, the charge transporting polymer is preferably a compound having a unit having an aromatic amine structure and/or a unit having a carbazole structure as a main structural unit from the viewpoint of high hole injectability and hole transportability. From this viewpoint, a ratio of a total number of the unit having an aromatic amine structure and/or the unit having a carbazole structure to a total number of structural units in the polymer (excluding structural units at a terminal portion) is preferably 40% or more, is more preferably 45% or more, and is even more preferably 50% or more. A ratio of a total number of the unit having an aromatic amine structure and/or the unit having a carbazole structure can also be set to 100%. A ratio of an aromatic amine structure is a value obtained by adding a ratio of the structural unit L1.

(Method for Manufacturing Charge Transporting Polymer)

The charge transporting polymer can be manufactured by various synthetic methods, and a manufacturing method is not particularly limited. For example, it is possible to use known coupling reactions such as Suzuki coupling, Negishi coupling, Sonogashira coupling, Stille coupling, and Buchwald-Hartwig coupling. Suzuki coupling causes a cross-coupling reaction between an aromatic boronic acid derivative and an aromatic halide using a Pd catalyst. According to Suzuki coupling, the charge transporting polymer can be easily manufactured by bonding desired aromatic rings to each other.

In a coupling reaction, for example, a Pd(0) compound, a Pd(II) compound, a Ni compound, and the like are used as a catalyst. Furthermore, it is possible to use a catalyst species generated by mixing tris(dibenzylideneacetone)dipalladium (0), palladium(II) acetate, or the like as a precursor with a phosphine ligand. For a method of synthesizing the charge transporting polymer, for example, the description of PCT International Publication No. WO2010/140553 can be referred to.

[Dopant]

The organic electronic material may further include a dopant. The dopant is not particularly limited as long as it is a compound that can exhibit a doping effect and improve charge transportability by being added to the organic electronic material. Doping includes p-type doping and n-type doping. In the p-type doping, a substance that acts as an electron acceptor is used as a dopant, and in the n-type doping, a substance that acts as an electron donor is used as a dopant. The p-type doping is preferable for improving hole transportability, and the n-type doping is preferable for improving electron transportability. The dopant used in the organic electronic material may be a dopant that exhibits any effect of the p-type doping or the n-type doping. Furthermore, one kind of dopant may be added alone, or a plurality of kinds of dopants may be mixed and added.

The dopant used for the p-type doping is an electron-accepting compound, and examples thereof include Lewis acids, protonic acids, transition metal compounds, ionic compounds, halogen compounds, π-conjugated compound, and the like. Specific examples are as follows. Examples of Lewis acids include $FeCl_3$, $PF_5$, $AsF_5$, $SbF_5$, $BF_5$, $BCl_3$, $BBr_3$, and the like. Examples of protonic acids include inorganic acids such as HF, HCl, HBr, $HNO_3$, $H_2SO_4$, and $HClO_4$, and organic acids such as benzenesulfonic acid, p-toluenesulfonic acid, dodecylbenzenesulfonic acid, polyvinyl sulfonic acid, methanesulfonic acid, trifluoromethanesulfonic acid, trifluoroacetic acid, 1-butane sulfonic acid, vinyl phenyl sulfonic acid, and camphorsulfonic acid. Examples of transition metal compounds include FeOCl, $TiCl_4$, $ZrCl_4$, $HfCl_4$, $NbF_5$, $AlC_3$, $NbCl_5$, $TaCl_5$, and $MoF_5$. Examples of ionic compounds include salts having perfluoroanions such as tetrakis(pentafluorophenyl)borate ion, tris(trifluoromethanesulfonyl)methide ion, bis(trifluoromethanesulfonyl)imide ion, hexafluoroantimonate ion, hexafluoroarsenate ion ($AsF_6^-$), tetrafluoroborate ion ($BF_4^-$), and hexafluorophosphate ion ($PF_6^-$), salts having a conjugate base of the above-mentioned protonic acid as anions, and the like. Examples of halogen compounds include $Cl_2$, $Br_2$, $I_2$, ICl, $ICl_3$, IBr, IF, and the like. Examples of π-conjugated compounds include tetracyanoethylene (TCNE), tetracyanoquinodimethane (TCNQ), and the like. In addition, it is also possible to use electron-accepting compounds disclosed in Japanese Patent Laid-Open No. 2000-36390, Japanese Patent Laid-Open No. 2005-75948, Japanese Patent Laid-Open No. 2003-213002, and the like. Lewis acids, ionic compounds, π-conjugated compounds, and the like are preferable.

The dopant used for the n-type doping is an electron-donating compound, and examples thereof include alkali metals such as Li and Cs; alkaline earth metal such as Mg and Ca; alkali metals such as LiF and $Cs_2CO_3$; and/or alkaline earth metal salts; metal complexes; electron-donating organic compounds; and the like.

It is preferable to use a compound that can act as a polymerization initiator for the polymerizable functional group as a dopant in order to facilitate change in solubility of an organic layer. Examples of substances having both a function as a dopant and a function as a polymerization initiator include the above-mentioned ionic compounds.

[Other Optional Components]

The organic electronic material may further contain a charge transporting low-molecular-weight compound, other charge transporting polymers, and the like.

[Content]

A content of the charge transporting polymer is preferably 50% by mass or more, is more preferably 70% by mass or more, and is even more preferably 80% by mass or more with respect to a total mass of the organic electronic material from the viewpoint of obtaining favorable charge transportability. A content thereof can also be set to 100% by mass.

In a case where the dopant is contained, a content thereof is preferably 0.01% by mass or more, is more preferably 0.1% by mass or more, and is even more preferably 0.5% by mass or more with respect to a total mass of the organic electronic material from the viewpoint of improving charge transportability of the organic electronic material. Furthermore, a content is preferably 50% by mass or less, is more preferably 30% by mass or less, and is even more preferably 20% by mass or less with respect to a total mass of the organic electronic material from the viewpoint of maintaining favorable film forming properties.

[Polymerization initiator]

In one embodiment, the organic electronic material may further contain a polymerization initiator. As the polymerization initiator, it is possible to use known radical polymerization initiators, cationic polymerization initiators, anionic polymerization initiators, and the like. It is preferable to use a substance having both a function as a dopant and a function as a polymerization initiator from the viewpoint that an ink composition can be then easily prepared. Examples of polymerization initiators having a function as a dopant include the above-mentioned ionic compounds. Examples of ionic compounds include salts having the above-mentioned perfluoroanions, and examples thereof include salts (onium salts) of perfluoroanions and iodonium ions or ammonium ions. Specific examples of such compounds include a compound having a structure represented by the following formula.

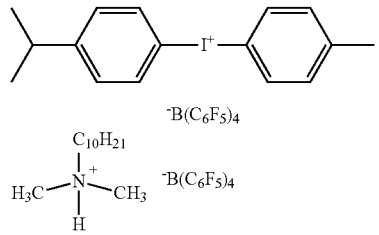

<Ink Composition>

One embodiment relates to an ink composition containing the organic electronic material of the above embodiment, and further containing a solvent. The solvent may be any solvent as long as it can dissolve or disperse the organic electronic material, and examples thereof are described below. By using such an ink composition, an organic layer can be easily formed by a simple method such as a coating method.

[Solvent]

As the solvent, it is possible to use water, an organic solvent, or a mixed solvent thereof. Examples of organic solvents include alcohols such as methanol, ethanol, and isopropyl alcohol; alkanes such as pentane, hexane, and octane; cyclic alkanes such as cyclohexane; aromatic hydrocarbons such as benzene, toluene, xylene, mesitylene, tetralin, and diphenylmethane; aliphatic ethers such as ethylene glycol dimethyl ether, ethylene glycol diethyl ether, and propylene glycol-1-monomethyl ether acetate; aromatic ethers such as 1,2-dimethoxybenzene, 1,3-dimethoxybenzene, anisole, phenetol, 2-methoxytoluene, 3-methoxytoluene, 4-methoxytoluene, 2,3-dimethylanisole, and 2,4-dimethylanisole; aliphatic esters such as ethyl acetate, n-butyl acetate, ethyl lactate, and n-butyl lactate; aromatic esters such as phenyl acetate, phenyl propionate, methyl benzoate, ethyl benzoate, propyl benzoate, and n-butyl benzoate; amide-based solvents such as N,N-dimethylformamide and N,N-dimethylacetamide; dimethyl sulfoxide; tetrahydrofuran; acetone; chloroform; methylene chloride; and the like. Aromatic hydrocarbons, aliphatic esters, aromatic esters, aliphatic ethers, aromatic ethers, and the like are preferable.

Conventional and typical charge transporting polymers are soluble in aromatic hydrocarbons such as benzene, but their solubility in ester-based solvents such as aliphatic esters and aromatic esters is extremely low, or they are insoluble in the ester-based solvents in many cases. On the other hand, the charge transporting polymer disclosed in the present specification exhibits excellent solubility also in ester-based solvents. Accordingly, various solvents can be used in combination in preparation of the ink composition, and applicability to a coating method such as inkjet printing can be enhanced.

[Additive]

The ink composition may further contain an additive as an optional component. Examples of additives include polymerization inhibitors, stabilizers, thickeners, gelling agents, flame retardants, antioxidants, reduction inhibitors, oxidizing agents, reducing agents, surface modifiers, emulsifiers, defoamers, dispersants, surfactants, and the like.

[Content]

A content of the solvent in the ink composition can be determined in consideration of application to various coating methods. For example, a content of the solvent at which a ratio of the charge transporting polymer to the solvent becomes 0.1% by mass or more is preferable, a content of the solvent at which a ratio of the charge transporting polymer to the solvent becomes 0.2% by mass or more is more preferable, and a content of the solvent at which a ratio of the charge transporting polymer to the solvent becomes 0.5% by mass or more is even more preferable. In addition, a content of the solvent at which a ratio of the charge transporting polymer to the solvent becomes 20% by mass or less is preferable, a content of the solvent at which a ratio of the charge transporting polymer to the solvent becomes 15% by mass or less is more preferable, and a content of the solvent at which a ratio of the charge transporting polymer to the solvent becomes 10% by mass or less is even more preferable.

<Organic Thin Film>

In an organic thin film (organic layer) according to the embodiment of the present disclosure, thermal deterioration and surface oxidation are inhibited because drying after forming a coating film is performed in a nitrogen atmosphere, and therefore the organic thin film has an excellent performance. Furthermore, in a case where the organic electronic material containing the charge transporting polymer having a polymerizable functional group is used as a material for forming the organic layer, an insolubilized organic layer can be obtained, and thereby multi-layering by a wet-type process becomes easy.

A thickness of the organic layer after drying or curing is preferably 0.1 nm or more, is more preferably 1 nm or more, and is even more preferably 3 nm or more from the viewpoint of improving efficiency of charge transport. In addition, a thickness of the organic layer is preferably 300 nm or less, is more preferably 200 nm or less, and is even more preferably 100 nm or less from the viewpoint of reducing electric resistance.

In one embodiment, a method for manufacturing the organic thin film includes a step of forming a coating film of the organic electronic material containing the charge transporting polymer, and a step of heating the coating film to form an organic thin film.

The formation of the coating film is preferably carried out in an air atmosphere or an inert gas atmosphere using a coating solution containing the organic electronic material and the solvent. Examples of coating methods include known method such as a spin coating method; a casting method; a dipping method; a plate printing method such as relief printing, intaglio printing, offset printing, flat plate printing, letterpress reversal offset printing, screen printing, and gravure printing; and a plateless printing method such as an inkjet printing method.

The formation of the organic thin film is carried out by heating the coating film in an air atmosphere or an inert gas atmosphere. The solvent in the coating film evaporates by heating the coating film, and thereby a dry film is obtained. In a case where the charge transporting polymer has a polymerizable functional group, a polymerization reaction of the charge transporting polymer proceeds by heating, and, if necessary, performing light irradiation, and thereby an insolubilized organic thin film is obtained.

Examples of the "inert gas" referred to herein include helium gas, argon gas, nitrogen gas, and a mixed gas thereof. The "inert gas atmosphere" meant that a concentration of an inert gas in the atmosphere is 99.5% or more in terms of volume ratio, is preferably 99.9% or more in terms of volume ratio, and is more preferably 99.99% or more in terms of volume ratio.

Heating of the coating film can be carried out using, for example, a hot plate or an oven. In order to carry out heating in the inert gas atmosphere, a hot plate is used in the inert gas atmosphere, or an atmosphere of the inside of an oven is made inert gas atmosphere.

Heating is preferably carried out at a temperature equal to or higher than a boiling point of the solvent from the viewpoint of efficiently removing the solvent. Furthermore, in a case where the charge transporting polymer has a polymerizable functional group, a temperature at which a polymerization reaction proceeds efficiently is preferable. In one embodiment, a temperature for heating of the coating film is preferably 140° C. or higher, is more preferably 180° C. or higher, and is even more preferably 190° C. or higher. Meanwhile, from the viewpoint of inhibiting a deterioration due to heating, a temperature is preferably 300° C. or lower, is more preferably 280° C. or lower, and is even more preferably 250° C. or lower.

<Organic Electronic Element>

In one embodiment, an organic electronic element includes at least the organic layer of the above embodiment. Examples of organic electronic elements include an organic EL element, an organic photoelectric conversion element, an organic transistor, and the like. The organic electronic element preferably has a structure in which an organic layer is disposed between at least a pair of electrodes.

[Organic EL Element]

An organic EL element of the above embodiment includes at least the organic layer of the above embodiment. The organic EL element generally includes a light emitting layer, an anode, a cathode, and a substrate. As necessary, the organic EL element includes other functional layers such as a hole injection layer, an electron injection layer, a hole transport layer, and an electron transport layer. Each of the layers may be formed by a vapor deposition method or a coating method. The organic EL element preferably includes the above-described organic layer as a light emitting layer or another functional layer, more preferably includes the above-described organic layer as another functional layer, and even more preferably includes the above-described organic layer as at least one of a hole injection layer and a hole transport layer.

The figure is a schematic cross-sectional view showing one embodiment of the organic EL element. The organic EL element of the figure is an element having a multilayer structure, and includes a substrate 8, an anode 2, a hole injection layer 3 and hole transport layer 6 having the organic layer of the above-described embodiment, a light emitting layer 1, an electron transport layer 7, an electron injection layer 5, and a cathode 4 in this order. Hereinafter, each of the layers will be described.

In the figure, for example, the hole injection layer 3 and the hole transport layer 6 are organic layers formed by a coating method using the above-described organic electronic material. However, the organic EL element according to the embodiment of the present invention is not limited to such a structure, and the organic layer may be another organic layer formed by using the above-described organic electronic material.

[Light Emitting Layer]

As a material used for the light emitting layer, it is possible to use a fluorescent material such as low-molecular-weight compounds, polymers, or dendrimers. Polymers are preferred because they are highly soluble in solvents and suitable for coating methods. Examples of fluorescent materials include fluorescent materials, phosphorescent materials, thermally activated delayed fluorescence (TADF) materials, and the like.

Examples of fluorescent materials include low-molecular-weight compounds such as perylene, coumarin, rubrene, quinacridone, stilbene, dye for dye laser, aluminum complex, and derivatives thereof; polymers such as polyfluorene, polyphenylene, polyphenylene vinylene, polyvinylcarbazole, fluorene-benzothiazol copolymer, fluorene-triphenylamine copolymers, and derivatives thereof; mixtures thereof; and the like.

As the phosphorescent material, a metal complex containing a metal such as Ir or Pt can be used. Examples of Ir complexes include FIr(pic) (iridium(III) bis[(4,6-difluorophenyl)-pyridinato-N,$C^2$] picolinate) which emits blue light; Ir(ppy)$_3$ (fac-tris(2-phenylpyridine) iridium) which emits green light; (btp)$_2$Ir(acac) (bis[2-(2'-benzo[4,5-a]thienyl) pyridinato-N,$C^3$]iridium(acetyl-acetonate)) which emits red light, and Ir(piq)$_3$ (tris(1-phenylisoquinoline)iridium) which emits red light; and the like. Examples of Pt complexes include 2,3,7,8,12,13,17,18-octaethyl-21H,23H-porphyrin platinum (PtOEP) which emits red light, and the like.

In a case where the light emitting layer contains a phosphorescent material, it is preferable to further incorporate a host material in addition to the phosphorescent material. As the host material, it is possible to use low-molecular-weight compounds, polymers, or dendrimers. Examples of low-molecular-weight compounds include 4,4'-bis(9H-carbazole-9-yl)biphenyl (CBP), 1,3-bis(9-carbazolyl)benzene (mCP), 4,4'-bis(carbazole-9-yl)-2,2'-dimethylbiphenyl (CDBP), derivatives thereof, and the like. Examples of polymers include the organic electronic material of the above-described embodiment, polyvinylcarbazole, polyphenylene, polyfluorene, derivatives thereof, and the like.

Examples of thermally activated delayed fluorescence materials include compounds disclosed in Adv. Mater., 21, 4802-4906 (2009); Appl. Phys. Lett., 98, 083302 (2011); Chem. Comm., 48, 9580 (2012); Appl. Phys. Lett., 101, 093306 (2012); J. Am. Chem. Soc., 134, 14706 (2012); Chem. Comm., 48, 11392 (2012); Nature, 492, 234 (2012); Adv. Mater., 25, 3319 (2013); J. Phys. Chem. A, 117, 5607 (2013); Phys. Chem. Chem. Phys., 15, 15850 (2013); Chem. Comm., 49, 10385 (2013); Chem. Lett., 43, 319 (2014); and the like.

[Hole transport layer and hole injection layer]

In the figure, the hole injection layer 3 and the hole transport layer 6 are organic layers formed by using the above-described organic electronic material. However, the organic EL element according to the embodiment of the present invention is not limited to such a structure, and the organic layer may be another organic layer formed by using the above-described organic electronic material. The other organic layer is preferably used as at least one of the hole transport layer and hole injection layer formed by using the above-described organic electronic material, and is more preferably used as at least the hole transport layer. For example, in a case where the organic EL element has the organic layer formed by using the above-described organic electronic material as the hole transport layer and further has the hole injection layer, a known material can be used for the hole injection layer. Furthermore, for example, in a case where the organic EL element has the organic layer formed by using the above-described organic electronic material as the hole injection layer and further has the hole transport layer, a known material can be used for the hole transport layer.

Examples of materials that can be used for the hole injection layer and the hole transport layer include aromatic amine compounds (for example, aromatic diamines such as N,N'-di(naphthalene-1-yl)-N,N'-diphenyl-benzidine (α-NPD)), phthalocyanine compounds, thiophene compounds (for example, a thiophene-based conductive polymer (for example, poly(3,4-ethylenedioxythiophene): poly(4-styrene sulfonate) (PEDOT: PSS)), and the like.

[Electron Transport Layer and Electron Injection Layer]

Examples of materials used for an electron transport layer and an electron injection layer include phenanthroline derivatives, bipyridine derivatives, nitro-substituted fluorene derivatives, diphenylquinone derivatives, thiopyrandioxide derivatives, fused rings such as naphthalene and perylene, tetracarboxylic anhydrides, carbodiimides, fluorenylidene methane derivatives, anthraquinodimethane and anthrone derivatives, oxadiazole derivatives, thiadiazole derivatives, benzimidazole derivatives (for example, 2,2',2''-(1,3,5-benzenetriyl)tris(1-phenyl-1H-benzimidazole) (TPBi)), quinoxaline derivatives, aluminum complexes (for example, bis(2-methyl-8-quinolinolate)-4-(phenylphenolato) aluminum (BAlq)), and the like. Furthermore, it is also possible use the organic electronic material of the above-described embodiment.

[Cathode]

As a cathode material, for example, a metal such as Li, Ca, Mg, Al, In, Cs, Ba, Mg/Ag, LiF, and CsF, or a metal alloy is used.

[Anode]

As an anode material, for example, a metal (for example, Au) or another material having conductivity is used. Examples of other materials include oxides (such as ITO: indium oxide/tin oxide), and conductive polymers (such as polythiophene-polystyrene sulfonic acid mixture (PEDOT: PSS)).

[Substrate]

As the substrate, it is possible to use glass, plastic, and the like. The substrate is preferably transparent and preferably has flexibility. Quartz glass, light-transmitting resin films, and the like are preferably used.

Examples of resin films include films mainly formed of the following substances: polyethylene terephthalate, polyethylene naphthalate, polyether sulfone, polyetherimide, polyetheretherketone, polyphenylene sulfide, polyarylate, polyimide, polycarbonate, cellulose triacetate, cellulose acetate propionate, and the like.

In a case where the resin film is used, the resin film may be used after being coated with an inorganic substance such as silicon oxide or silicon nitride in order to inhibit permeation of water vapor, oxygen, and the like.

[Emission Color]

An emission color of the organic EL element is not particularly limited. A white organic EL element is preferable because it can be used for various lighting fixtures such as household lighting, vehicle interior lighting, clocks, and liquid crystal backlights.

As a method of forming a white organic EL element, it is possible to use a method including emitting a plurality of emission colors at the same time using a plurality of fluorescent materials and mixing the colors. A combination of a plurality of emission colors is not particularly limited, and examples thereof include a combination containing three emission maximum wavelengths of blue, green, and red; a combination containing two maximum emission wavelengths of blue and yellow, yellowish green and orange, or the like; and the like. An emission color can be controlled by adjusting the type and amount of a fluorescent material.

<Display Element, Lighting Device, and Display Device>

In one embodiment, a display element includes the organic EL element of the above-described embodiment. For example, a color display element can be obtained using an organic EL element as an element corresponding to each pixel of red, green, and blue (RGB). Examples of methods of forming an image include a simple matrix type in which electrodes disposed in a matrix shape directly drive individual organic EL elements arranged on a panel, and an active matrix type in which each element is driven by disposing a thin film transistor.

Furthermore, in one embodiment, a lighting device includes the organic EL element of the above-described embodiment. Furthermore, in one embodiment, a display device includes the lighting device, and a liquid crystal element as a display means. For example, the display device can be a display device in which the lighting device of the above-described embodiment is used as a backlight and a known liquid crystal element is used as a display means, that is, a liquid crystal display device.

EXAMPLES

1. Preparation of Charge Transporting (Hole Transporting) Polymer (Preparation of Pd Catalyst)

Tris(dibenzylideneacetone)dipalladium (73.2 mg, 80 umol) was weighed into a sample tube at room temperature in a glove box under a nitrogen atmosphere, toluene (15 mL)

was added thereto, and the mixture was stirred for 30 minutes. In the same manner, tris(t-butyl)phosphine (129.6 mg, 640 μmol) was weighed into a sample tube, toluene (5 mL) was added thereto, and the mixture was stirred for 5 minutes. These solutions were mixed, stirred at room temperature for 30 minutes, and used for a catalyst. All solvents were used after being degassed with nitrogen bubbles for 30 minutes or longer.

Various monomers used in preparation of hole transporting polymers 1 to 13 described below are as follows.

(Divalent monomer)

Monomer A1

Monomer A2

Monomer A3

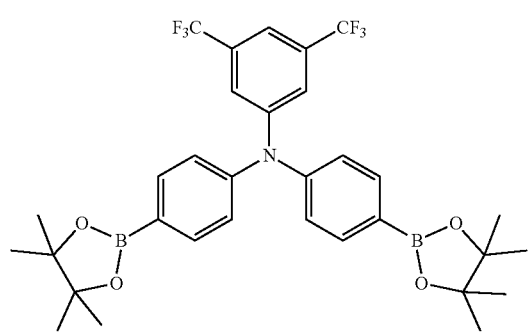

-continued

Monomer A4

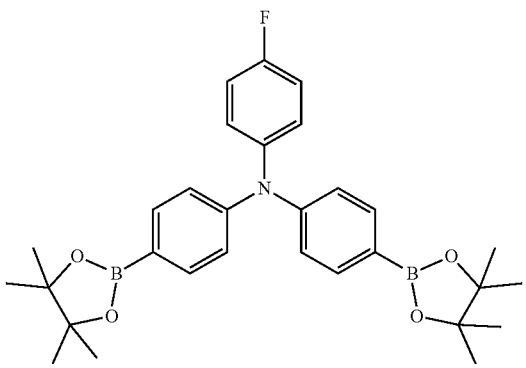

Monomer A4

(Trivalent monomer)

Monomer B1

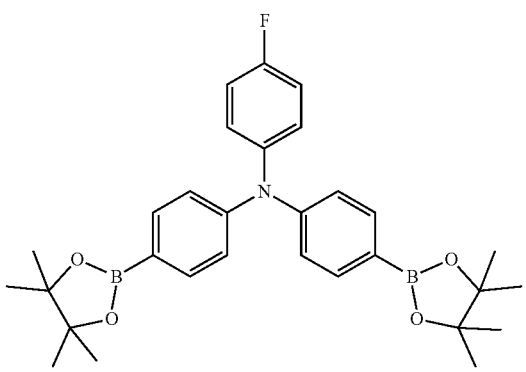

[Chem. 19]

(Monovalent monomer)

Monomer C2

Monomer C2

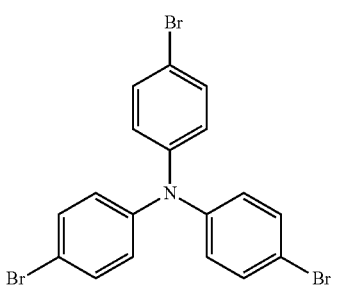

Monomer C3

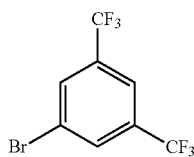

(Preparation of Hole Transporting Polymer 1)

A monomer A1 (2.5 mmol), a monomer A2 (2.5 mmol), a monomer B1 (2.0 mmol), a monomer C1 (2.0 mmol), a monomer C2 (2.0 mmol), methyltri-n-octylammonium chloride ("Aliquat 336" manufactured by Alfa Aesar) (0.03 g), potassium hydroxide (1.12 g), pure water (5.54 mL), and toluene (15 mL) were added in a three-neck round-bottom flask, and the Pd catalytic toluene solution (1.0 mL) prepared above was further added thereto and mixed. This mixed solution was heated to reflux for 2 hours to proceed the reaction. All operations up to this point were performed under a nitrogen stream. In addition, all solvents were used after being degassed with nitrogen bubbles for 30 minutes or longer.

After completion of the reaction, an organic layer was washed with water, and the organic layer was poured into methanol-water (9:1). The resulting precipitate was recovered by suction filtration and washed with methanol-water (9:1). The obtained precipitate was dissolved in toluene and reprecipitated from methanol. The obtained precipitate was recovered by suction filtration and dissolved in toluene. A metal adsorbent ("Triphenylphosphine, polymer-bound on styrene-divinylbenzene copolymer" manufactured by Strem Chemicals, Inc., 200 mg per 100 mg of the precipitate) was added thereto, and the mixture was stirred at 80° C. for 2 hours. After the stirring was completed, the metal adsorbent and the insoluble matter were filtered and removed, and the filtrate was reprecipitated from methanol. The resulting precipitate was recovered by suction filtration and washed with methanol. The obtained precipitate was vacuum dried, and thereby a hole transporting polymer 1 was obtained.

The obtained hole transporting polymer 1 had a number average molecular weight of 21,700 and a weight-average molecular weight of 49,400.

The number average molecular weight and the weight-average molecular weight were measured by polystyrene conversion (GPC) using tetrahydrofuran (THF) as an eluent. Measurement conditions were as follows.

Liquid delivering pump: L-6050 of Hitachi High-Technologies Corporation

UV-Vis detector: L-3000 of Hitachi High-Technologies Corporation

Column: Gelpack (registered trademark) GL-A160S/GL-A150S of Hitachi Chemical Co., Ltd.

Eluent: THF (for HPLC, not containing a stabilizer) of Wako Pure Chemical Industries, Ltd.

Flow velocity: 1 mL/min

Column temperature: room temperature

Molecular weight standard substance: standard polystyrene (Preparation of Hole Transporting Polymer 2)

A monomer A1 (2.0 mmol), a monomer A2 (3.0 mmol), a monomer B1 (2.0 mmol), a monomer C1 (2.0 mmol), a monomer C2 (2.0 mmol), methyltri-n-octylammonium chloride ("Aliquat 336" manufactured by Alfa Aesar) (0.03 g), potassium hydroxide (1.12 g), pure water (5.54 mL), and toluene (17 mL) were added in a three-neck round-bottom flask, and the Pd catalytic toluene solution (1.0 mL) prepared above was further added thereto and mixed. This mixed solution was heated to reflux for 2 hours to proceed the reaction. All operations up to this point were performed under a nitrogen stream. In addition, all solvents were used after being degassed with nitrogen bubbles for 30 minutes or longer. Thereafter, the same operation as the preparation of the hole transporting polymer 1 was performed.

The obtained hole transporting polymer 2 had a number average molecular weight of 12,000 and a weight-average molecular weight of 38,200.

(Preparation of Hole Transporting Polymer 3)

A monomer A1 (1.5 mmol), a monomer A2 (3.5 mmol), a monomer B1 (2.0 mmol), a monomer C1 (2.0 mmol), a monomer C2 (2.0 mmol), methyltri-n-octylammonium chloride ("Aliquat 336" manufactured by Alfa Aesar) (0.03 g), potassium hydroxide (1.12 g), pure water (5.54 mL), and toluene (17 mL) were added in a three-neck round-bottom flask, and the Pd catalytic toluene solution (1.0 mL) prepared above was further added thereto and mixed. The obtained mixed solution was heated to reflux for 2 hours to proceed the reaction. All operations up to this point were performed under a nitrogen stream. In addition, all solvents were used after being degassed with nitrogen bubbles for 30 minutes or longer. Thereafter, the same operation as the preparation of the hole transporting polymer 1 was performed.

The obtained hole transporting polymer 3 had a number average molecular weight of 10,800 and a weight-average molecular weight of 40,000.

(Preparation of Hole Transporting Polymer 4)

A monomer A1 (2.5 mmol), a monomer A2 (2.5 mmol), a monomer B1 (2.0 mmol), a monomer C1 (2.0 mmol), a monomer C3 (2.0 mmol), methyltri-n-octylammonium chloride ("Aliquat 336" manufactured by Alfa Aesar) (0.03 g), potassium hydroxide (1.12 g), pure water (5.54 mL), and toluene (17 mL) were added in a three-neck round-bottom flask, and the Pd catalytic toluene solution (1.0 mL) prepared above was further added thereto and mixed. This mixed solution was heated to reflux for 2 hours to proceed the reaction. All operations up to this point were performed under a nitrogen stream. In addition, all solvents were used after being degassed with nitrogen bubbles for 30 minutes or longer. Thereafter, the same operation as the preparation of the hole transporting polymer 1 was performed.

The obtained hole transporting polymer 4 had a number average molecular weight of 16,000 and a weight-average molecular weight of 44,000.

(Preparation of Hole Transporting Polymer 5)

A monomer A1 (3.0 mmol), a monomer A3 (2.0 mmol), a monomer B1 (2.0 mmol), a monomer C1 (2.0 mmol), a monomer C3 (2.0 mmol), methyltri-n-octylammonium chloride ("Aliquat 336" manufactured by Alfa Aesar) (0.03 g), potassium hydroxide (1.12 g), pure water (5.54 mL), and toluene (50 mL) were added in a three-neck round-bottom flask, and the Pd catalytic toluene solution (1.0 mL) prepared above was further added thereto and mixed. This mixed solution was heated to reflux for 2 hours to proceed the reaction. All operations up to this point were performed under a nitrogen stream. In addition, all solvents were used after being degassed with nitrogen bubbles for 30 minutes or longer. Thereafter, the same operation as the preparation of the hole transporting polymer 1 was performed.

The obtained hole transporting polymer 5 had a number average molecular weight of 19,900 and a weight-average molecular weight of 49,200.

(Preparation of Hole Transporting Polymer 6)

A monomer A1 (5.0 mmol), a monomer B1 (2.0 mmol), a monomer C1 (2.0 mmol), a monomer C2 (2.0 mmol), methyltri-n-octylammonium chloride ("Aliquat 336" manufactured by Alfa Aesar) (0.03 g), potassium hydroxide (1.12 g), pure water (5.54 mL), and toluene (17 mL) were added in a three-neck round-bottom flask, and the Pd catalytic toluene solution (1.0 mL) prepared above was further added thereto and mixed. This mixed solution was heated to reflux for 2 hours to proceed the reaction. All operations up to this point were performed under a nitrogen stream. In addition, all solvents were used after being degassed with nitrogen bubbles for 30 minutes or longer. Thereafter, the same operation as the preparation of the hole transporting polymer 1 was performed.

The obtained hole transporting polymer 6 had a number average molecular weight of 14,300 and a weight-average molecular weight of 60,000.

(Preparation of Hole Transporting Polymer 7)

A monomer A1 (5.0 mmol), a monomer B1 (2.0 mmol), a monomer C1 (2.0 mmol), a monomer C3 (2.0 mmol), methyltri-n-octylammonium chloride ("Aliquat 336" manufactured by Alfa Aesar) (0.03 g), potassium hydroxide (1.12 g), pure water (5.54 mL), and toluene (17 mL) were added in a three-neck round-bottom flask, and the Pd catalytic toluene solution (1.0 mL) prepared above was further added thereto and mixed. This mixed solution was heated to reflux for 2 hours to proceed the reaction. All operations up to this point were performed under a nitrogen stream. In addition, all solvents were used after being degassed with nitrogen bubbles for 30 minutes or longer. Thereafter, the same operation as the preparation of the hole transporting polymer 1 was performed.

The obtained hole transporting polymer 7 had a number average molecular weight of 14,300 and a weight-average molecular weight of 57,800.

(Preparation of Hole Transporting Polymer 8)

A monomer A1 (2.0 mmol), a monomer A4 (3.0 mmol), a monomer B1 (2.0 mmol), a monomer C1 (2.0 mmol), a monomer C2 (2.0 mmol), methyltri-n-octylammonium chloride ("Aliquat 336" manufactured by Alfa Aesar) (0.03 g), potassium hydroxide (1.12 g), pure water (5.54 mL), and toluene (17 mL) were added in a three-neck round-bottom flask, and the Pd catalytic toluene solution (1.0 mL) prepared above was further added thereto and mixed. This mixed solution was heated to reflux for 2 hours to proceed the reaction. All operations up to this point were performed under a nitrogen stream. In addition, all solvents were used after being degassed with nitrogen bubbles for 30 minutes or longer. Thereafter, the same operation as the preparation of the hole transporting polymer 1 was performed.

The obtained hole transporting polymer 8 had a number average molecular weight of 20,700 and a weight-average molecular weight of 50,400.

(Preparation of Hole Transporting Polymer 9)

A monomer A1 (2.0 mmol), a monomer A4 (3.0 mmol), a monomer B1 (2.0 mmol), a monomer C1 (2.0 mmol), a monomer C3 (2.0 mmol), methyltri-n-octylammonium chloride ("Aliquat 336" manufactured by Alfa Aesar) (0.03 g), potassium hydroxide (1.12 g), pure water (5.54 mL), and toluene (17 mL) were added in a three-neck round-bottom flask, and the Pd catalytic toluene solution (1.0 mL) prepared above was further added thereto and mixed. This mixed solution was heated to reflux for 2 hours to proceed the reaction. All operations up to this point were performed under a nitrogen stream. In addition, all solvents were used after being degassed with nitrogen bubbles for 30 minutes or longer. Thereafter, the same operation as the preparation of the hole transporting polymer 1 was performed.

The obtained hole transporting polymer 9 had a number average molecular weight of 17,400 and a weight-average molecular weight of 44,900.

(Preparation of Hole Transporting Polymer 10)

A monomer A2 (5.0 mmol), a monomer B1 (2.0 mmol), a monomer C1 (2.0 mmol), a monomer C2 (2.0 mmol), methyltri-n-octylammonium chloride ("Aliquat 336" manufactured by Alfa Aesar) (0.03 g), potassium hydroxide (1.12 g), pure water (5.54 mL), and toluene (50 mL) were added in a three-neck round-bottom flask, and the Pd catalytic toluene solution (1.0 mL) prepared above was further added thereto and mixed. This mixed solution was heated to reflux for 2 hours to proceed the reaction. All operations up to this point were performed under a nitrogen stream. In addition, all solvents were used after being degassed with nitrogen bubbles for 30 minutes or longer. Thereafter, the same operation as the preparation of the hole transporting polymer 1 was performed.

The obtained hole transporting polymer 10 had a number average molecular weight of 15,700 and a weight-average molecular weight of 45,100.

(Preparation of hole transporting polymer 11)

A monomer A2 (5.0 mmol), a monomer B1 (2.0 mmol), a monomer C1 (2.0 mmol), a monomer C3 (2.0 mmol), methyltri-n-octylammonium chloride ("Aliquat 336" manufactured by Alfa Aesar) (0.03 g), potassium hydroxide (1.12 g), pure water (5.54 mL), and toluene (50 mL) were added in a three-neck round-bottom flask, and the Pd catalytic toluene solution (1.0 mL) prepared above was further added thereto and mixed. This mixed solution was heated to reflux for 2 hours to proceed the reaction. All operations up to this point were performed under a nitrogen stream. In addition, all solvents were used after being degassed with nitrogen bubbles for 30 minutes or longer. Thereafter, the same operation as the preparation of the hole transporting polymer 1 was performed.

The obtained hole transporting polymer 11 had a number average molecular weight of 13,300 and a weight-average molecular weight of 36,200.

(Preparation of hole transporting polymer 12)

A monomer A4 (5.0 mmol), a monomer B1 (2.0 mmol), a monomer C1 (2.0 mmol), a monomer C2 (2.0 mmol), methyltri-n-octylammonium chloride ("Aliquat 336" manufactured by Alfa Aesar) (0.03 g), potassium hydroxide (1.12 g), pure water (5.54 mL), and toluene (50 mL) were added in a three-neck round-bottom flask, and the Pd catalytic toluene solution (1.0 mL) prepared above was further added thereto and mixed. This mixed solution was heated to reflux for 2 hours to proceed the reaction. All operations up to this point were performed under a nitrogen stream. In addition, all solvents were used after being degassed with nitrogen bubbles for 30 minutes or longer. Thereafter, the same operation as the preparation of the hole transporting polymer 1 was performed.

The obtained hole transporting polymer 12 had a number average molecular weight of 12,300 and a weight-average molecular weight of 59,600.

(Preparation of hole transporting polymer 13)

A monomer A4 (5.0 mmol), a monomer B1 (2.0 mmol), a monomer C1 (2.0 mmol), a monomer C3 (2.0 mmol), methyltri-n-octylammonium chloride ("Aliquat 336" manufactured by Alfa Aesar) (0.03 g), potassium hydroxide (1.12 g), pure water (5.54 mL), and toluene (50 mL) were added in a three-neck round-bottom flask, and the Pd catalytic toluene solution (1.0 mL) prepared above was further added thereto and mixed. This mixed solution was heated to reflux for 2 hours to proceed the reaction. All operations up to this point were performed under a nitrogen stream. In addition, all solvents were used after being degassed with nitrogen bubbles for 30 minutes or longer. Thereafter, the same operation as the preparation of the hole transporting polymer 1 was performed.

The obtained hole transporting polymer 13 had a number average molecular weight of 15,100 and a weight-average molecular weight of 56,500.

2. Evaluation of Solubility of Charge Transporting Polymer

Examples 1 to 9 and Comparative Examples 1 to 4

The solubility of each of the hole transporting polymers prepared above in various solvents was evaluated according to the following method. The results are shown in Table 1.

(Method of Evaluating Solubility)

An arbitrary amount of each of the hole transporting polymers prepared above was weighed into a sample tube. Various solvents were added thereto after adjusting amounts of the various solvents so that a concentration of the polymer was 3 wt %. Then, the mixture was stirred at 300 rpm for 24 hours at room temperature (25° C.) using a mix rotor. The solution obtained after stirring was visually observed, and solubility was judged according to the following criteria.

(Evaluation Criteria for Solubility)

G: Favorable solubility (meaning that the polymer dissolved in the solvent, and more specifically, no precipitate could be checked, and the solution was transparent without turbidity)

P: Poor solubility (meaning that the polymer did not dissolve in the solvent, and more specifically, a precipitate was checked, or the solution had turbidity)

TABLE 1

| | | Solvent | | | | |
|---|---|---|---|---|---|---|
| | Polymer used | Mesitylene | Benzyl benzoate | Butyl benzoate | Butyl acetate | Ethyl acetate |
| Example 1 | Polymer 1 | G | G | G | P | P |
| Example 2 | Polymer 2 | G | G | G | P | P |
| Example 3 | Polymer 3 | G | G | G | P | P |
| Example 4 | Polymer 4 | G | G | G | G | P |
| Example 5 | Polymer 5 | G | G | G | G | G |
| Example 6 | Polymer 6 | G | G | G | G | G |
| Example 7 | Polymer 7 | G | G | G | G | G |
| Example 8 | Polymer 8 | G | G | G | P | P |
| Example 9 | Polymer 9 | G | G | G | P | P |
| Comparative Example 1 | Polymer 10 | G | P | P | P | P |
| Comparative Example 2 | Polymer 11 | G | G | P | P | P |
| Comparative Example 3 | Polymer 12 | P | G | P | P | P |
| Comparative Example 4 | Polymer 13 | P | G | P | P | P |

Based on the comparison between the examples and the comparative examples, it was found that high solubility in various solvents could be obtained in a case where the charge transporting polymer had the structure represented by Formula (1) (structure of the monomer A1) having a fluoroalkyl group at a specific position on a benzene ring of a triphenylamine structure. It was also found that higher solubility could be obtained in a case where the charge transporting polymer further had a fluoroalkyl group at a terminal portion.

Furthermore, when a hole-only device (HOD), which had an organic thin film obtained by applying a solution containing the charge transporting polymer of each of the examples, was manufactured and a voltage was applied thereto, it was confirmed that a current flowed in each of the cases, and a hole transporting function was imparted.

Based on the above results, it is clear that, according to the present invention, it is possible to provide a charge transporting polymer which can be suitably used as an organic electronic material and exhibits high solubility in various solvents. Accordingly, according to the present invention, by using an organic electronic material containing the above-mentioned charge transporting polymer, it is possible to provide an ink composition and an organic thin film which are capable of improving element characteristics. Furthermore, it is possible to provide an organic electronic element and an organic EL element which have excellent element characteristics, and to provide a display element, a lighting device, and a display device which are formed using the organic EL element.

The invention claimed is:

1. An organic electronic material comprising:
a charge transporting polymer having a structure branched in three or more directions,
wherein the charge transporting polymer comprises a trivalent or higher-valent structural unit, a divalent structural unit comprising a structural unit L1 having a structure represented by Formula (1) below, and a monovalent structural unit comprising a structural unit T1 having a structure represented by Formula (4-4) below,

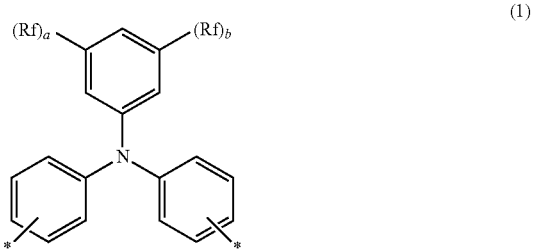

in Formula (1), Rf's are each independently a fluoroalkyl group, a and b are 0 or 1, and a and b are not both 0 at the same time, —Ar—O—(CH$_2$)$_n$—Z (4-4)

in Formula (4-4), Ar is an arylene group or a heteroarylene group, n is 1 to 4, and Z is a polymerizable functional group.

2. The organic electronic material according to claim 1, wherein the charge transporting polymer has hole injectability or hole transportability.

3. The organic electronic material according to claim 1, wherein the charge transporting polymer further has one or more structures selected from the group consisting of an aromatic amine structure, a pyrrole structure, a carbazole structure, a thiophene structure, a benzene structure, an aniline structure, a phenoxazine structure, and a fluorene structure, where the structure represented by Formula (1) is excluded.

4. The organic electronic material according to claim 1, wherein the polymerizable functional group is at least one selected from the group consisting of an oxetane group, an epoxy group, a vinyl group, an acryloyl group, and a methacryloyl group.

5. The organic electronic material according to claim 1, further comprising a polymerization initiator.

6. The organic electronic material according to claim 5, wherein the polymerization initiator is an ionic compound.

7. The organic electronic material according to claim 6, wherein the ionic compound is an onium salt.

8. An ink composition comprising:
the organic electronic material according to claim 1; and
a solvent.

9. An organic thin film which is formed using the organic electronic material according to claim 1.

10. An organic electroluminescent element comprising the organic thin film according to claim 9.

11. The organic electroluminescent element according to claim 10, further comprising a flexible substrate.

12. The organic electroluminescent element according to claim 10, further comprising a resin film substrate.

13. A display element comprising the organic electroluminescent element according to claim 10.

14. A lighting device comprising the organic electroluminescent element according to claim 10.

15. A display device comprising:
the lighting device according to claim 14; and
a liquid crystal element as a display means.

16. The organic electronic material according to claim 1, wherein a ratio of the structural unit L1 in the divalent structural unit is 30 mol % or more.

17. The organic electronic material according to claim 1, wherein the monovalent structural unit of the charge transporting polymer further comprises a monovalent structural unit T2 represented by Formula (5) below,

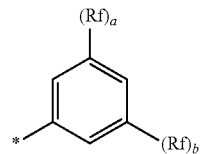

(5)

in Formula (5), Rf's are each independently a fluoroalkyl group, a and b are 0 or 1, and a and b are not both 0 at the same time.

* * * * *